United States Patent [19]
Iwata

[11] Patent Number: 5,849,634
[45] Date of Patent: Dec. 15, 1998

[54] METHOD OF FORMING SILICIDE FILM ON SILICON WITH OXYGEN CONCENTRATION BELOW $10^{18}$/CM$^3$

[76] Inventor: Hiroshi Iwata, 2-4-13, Shigigaoka, Sango-cho, Ikoma-gun, Nara-ken, Japan

[21] Appl. No.: 736,907

[22] Filed: Oct. 25, 1996

Related U.S. Application Data

[63] Continuation-in-part of Ser. No. 423,585, Apr. 14, 1995, abandoned.

[30] Foreign Application Priority Data

Apr. 15, 1994 [JP] Japan .................................. 6-076959

[51] Int. Cl.$^6$ .................................................. H01L 21/28
[52] U.S. Cl. .......................... 438/655; 438/656; 438/658; 438/664; 438/682; 438/683
[58] Field of Search .................................... 437/193, 192, 437/200; 438/655, 656, 658, 664, 682, 683

[56] References Cited

U.S. PATENT DOCUMENTS

| | | | |
|---|---|---|---|
| 4,384,301 | 5/1983 | Tasch, Jr. et al. . | |
| 4,788,160 | 11/1988 | Havemann et al. .................... | 437/200 |
| 4,897,287 | 1/1990 | Berger et al. . | |
| 5,043,300 | 8/1991 | Nulman .................................. | 437/200 |
| 5,210,043 | 5/1993 | Hosaka .................................. | 437/200 |
| 5,213,622 | 5/1993 | Bohling et al. ............................ | 134/3 |
| 5,232,871 | 8/1993 | Ho . | |
| 5,236,868 | 8/1993 | Nulman .................................. | 437/200 |
| 5,393,565 | 2/1995 | Suzuki et al. ........................... | 437/200 |
| 5,470,794 | 11/1995 | Anjum et al. ............................ | 437/200 |
| 5,525,543 | 6/1996 | Chen . | |
| 5,550,084 | 8/1996 | Anjum et al. ............................ | 437/192 |
| 5,616,518 | 4/1997 | Foo et al. ................................. | 438/680 |
| 5,695,569 | 12/1997 | Douglas .................................... | 134/1.3 |

FOREIGN PATENT DOCUMENTS

| | | |
|---|---|---|
| 0392725 | 10/1990 | European Pat. Off. . |
| 0452891 | 10/1991 | European Pat. Off. . |
| 61-278166 | 12/1986 | Japan . |
| 62-076560 | 4/1987 | Japan . |
| 63-227019 | 9/1988 | Japan . |
| 02026051 | 1/1990 | Japan . |
| 4-3924 | 1/1992 | Japan . |
| 5-291181 | 11/1993 | Japan . |

OTHER PUBLICATIONS

Byun et al, "TiN/TiSi2 Formation Using TiNx Layer and Its Feasabilities in ULSI", Extended Abstracts of the Aug. 1994 International Conferences on Solid State Devices and Material, pp. 640–642.

Joswig et al, "Stoichiometry effects in TiN diffusion barriers", Thin Solid Films, vol. 221, pp. 228–232, 1992.

Byun et al., "TiN/T;Si2 formation using TiNx layer and its feasibilities in VLSI" *Int. Conf. on Solid State Devices & Materials* (Aug. 1994) pp. 640–642.

Joswig et al., "Stoichiometry effects in TiW diffusion barriers" *Thin Solid Films* (1992) pp. 228–232.

Tsukamoto et al., "Self–aligned titanium solicidation by lamp annealing" *Extended Abstracts of the 16th* (1984 *International*) *Conference of Solid State Devices and Materials*, Kobe (1984) pp. 47–50.

*Primary Examiner*—John Niebling
*Assistant Examiner*—Thomas G. Bilodeau

[57] ABSTRACT

A method for fabricating a semiconductor device of the invention, the method includes the steps of: providing an oxygen concentration in a region of a silicon film of $1\times10^{18}$ cm$^3$ or less; depositing a film including a metal on the silicon film; and reacting the silicon film with the film including a metal so as to form a metal silicide film in the region of the silicon film.

20 Claims, 16 Drawing Sheets

Second RTA temperature (°c)

Prior art

First example

▲ TiSi$_2$/n$^+$ (Phosphorus diffusion)
● TiSi$_2$/n$^+$ (Arsenic implantation)
○ TiSi$_2$/p$^+$ (Boron implantation)

$V_G$ step = 0.4V
Gate oxide film thickness: 5nm
Gate side wall film thickness: 100nm
Gate length: 0.26 μm

METHOD OF FORMING SILICIDE FILM ON SILICON WITH OXYGEN CONCENTRATION BELOW $10^{18}/CM^3$

CROSS-REFERENCE TO RELATED APPLICATIONS

This is a continuation-in-part of application Ser. No. 08/423,585, filed Apr. 14,1995, now abandoned.

BACKGROUND OF THE INVENTION

1. Field of the Invention

The present invention relates to a method for fabricating a semiconductor device, more particularly to a method for fabricating a low resistance titanium silicide film providing good heat-resistant properties.

2. Description of the Related Art

A conventional self-aligned and silicidation method is described with reference to FIG. 12. First, a field oxide film 402, a gate oxide film 403 and a gate electrode 404 made of poly-crystalline silicon and having side walls covered with an insulating film 405 are formed on a semiconductor substrate 401 as shown in FIG. 12A. Then, as shown in FIG. 12B, after forming an oxide film 406, a high concentration of impurity ions are implanted through the oxide film 406 into the portions to be source/drain regions. Arsenic ions are implanted in the case of NMOS, while boron ions are implanted in the case of PMOS. Thereafter, annealing for activation is performed (e.g., in nitrogen gas ambient, at 900° C. for 10 minutes) so as to form source/drain regions 407. Next, as shown in FIG. 12C, the oxide film 406 over the source/drain regions 407 and the gate electrode 404 is removed by using a solution containing hydrofluoric acid or the like, and thereafter a titanium metal film 408 is deposited by sputtering in argon gas ambient. Then, as shown in FIG. 12D, first RTA (Rapid Thermal Annealing) is performed for about 20 seconds at 650° in nitrogen gas ambient, so as to make silicon and a titanium metal in the source/drain regions 407 and the gate electrode 404 react with each other, thereby forming titanium silicide films 409 each having a $TiSi_2$ C 49 crystal structure which is stoichiometrically metastable (herein, the surface of the titanium metal film 408 changes into a titanium nitride film 410). Then, as shown in FIG. 12E, an unreacted titanium metal film 408 and the titanium nitride film 410 formed by the first RTA are removed by selective etching by using a mixed solution of sulfuric acid and a hydrogen peroxide solution. Thereafter, second RTA is performed at 800° C. for about 20 seconds in nitrogen gas ambient so as to change the titanium silicide film 409 into a titanium silicide film 411 having a $TiSi_2$ C 54 crystal structure which is, stoichiometrically stable.

In the method for fabricating a semiconductor device, after the step of forming transistors, an interlevel insulator is deposited on the transistor. Then, an annealing step for densifying and reflowing the interlevel insulator is performed. Normally, the annealing step is effective at 850° C. or more, and preferably at 900° or more.

However, the conventional process for forming a titanium silicide film has the following problems:

(1) The inclusion of oxygen resulting from process steps (e.g., a step of implanting impurity ions through the oxide film) cannot be prevented in the system of reaction of Ti and Si, no matter how the cleanliness of the instrument and surrounding conditions for the fabrication are improved. As a result, the silicidation reaction occurs in the ternary system of Ti, Si and O.

(2) In the silicidation reaction in the ternary system, $SiO_2$ is predominantly formed in the grain boundary of $TiSi_2$, which makes the sheet resistance higher and results in deterioration of heat resistance. This problem is prominent especially in silicidation for interconnection with a width less than the grain size of $TiSi_2$. That is, in silicidation of the interconnection with a width less than the grain size of $TiSi_2$, the change in crystal structure from C49 to C 54 is hard to occur in RTA at 900° C. or less. As a result, a titanium silicide film having extremely high electrical resistance (sheet resistance) is obtained. In the case of performing the RTA at a temperature of 900° C. or more, the change in crystal structure from C49 to C 54 is likely to occur. However, heat resistance deterioration and agglomeration of the silicide film are likely to occur in comparison with the silicide film obtained by silicidation of the interconnection with a large width. In addition, since the agglomeration of the silicide film starts also in the silicide film with a further large width, the agglomeration is inevitable.

(4) In the case where the silicide film is formed by the conventional silicidation method and then annealing at a temperature of more than 8000C is performed for the reflow of the interlevel insulator, the agglomeration occurs and the junction leakage of the source and drain regions increases, whereas the reliability of the gate oxide film deteriorates. In addition, the interconnection resistance rises, and especially, in the case of the silicidation of the interconnection (e.g., a gate electrode) with a width smaller than the grain size of $TiSi_2$, the sheet resistance rises to the level as high as the level in the interconnection not having a silicide film.

SUMMARY OF THE INVENTION

A method for fabricating a semiconductor device of this invention, the method includes the steps of: providing an oxygen concentration in a region of a silicon film of $1\times10^{18}$ $cm^{-3}$ or less; depositing a film including a metal on the silicon film; and reacting the silicon film with the film including a metal so as to form a metal silicide film in the region of the silicon film.

In one embodiment of the invention, the film including a metal comprises a titanium film, and the metal silicide film comprises a titanium suicide film.

In another embodiment of the invention, the film including a metal comprises a titanium nitride film in which titanium atoms are more than nitride atoms, and the metal silicide film comprises a titanium silicide film, In still another embodiment of the invention, the method further includes the step of forming the titanium silicide film including $TiSi_2$ C54 crystal grains which are in contact with each other via TiN.

In yet another embodiment of the invention, the method further includes the step of forming the titanium silicide film including $TiSi_2$ C54 crystal grains which are in contact with each other via TiN.

In yet another embodiment of the invention, the method further includes the step of: implanting silicon ions in the vicinity of an interface between the titanium film and the silicon film, after depositing the titanium film and before reacting the silicon film with the titanium film.

In yet another embodiment of the invention, the method further includes the step of: implanting silicon ions in the vicinity of an interface between the titanium nitride film and the silicon film, after depositing the titanium nitride film and before reacting the silicon film with the titanium nitride film.

In yet another embodiment of the invention, the method further includes the step of: implanting silicon ions in the vicinity of an interface between the titanium film and the silicon film, after depositing the titanium film and before reacting the silicon film with the titanium film.

In yet another embodiment of the invention, the method further includes the step of: implanting silicon ions in the vicinity of an interface between the titanium nitride film and the silicon film, after depositing the titanium nitride film and before reacting the silicon film with the titanium nitride film.

In yet another embodiment of the invention, the titanium nitride film is deposited by a reactive sputtering method using a titanium target in a mixture gas of an argon gas and a nitrogen gas, the mixing ratio of the nitrogen gas in the mixture gas being in the range of 0.1% to 10%.

In yet another embodiment of the invention, the method further includes the steps of: removing a native oxide film on the silicon film And then depositing the titanium film on the silicon film without being open to atmosphere, performing a first rapid thermal annealing in a nitrogen gas and making the titanium film and the silicon film react with each other so as to form a titanium silicide film having a $TiSi_2$ C49 crystal structure which is stoichiometrically metastable, and form a titanium nitride film in the surface region of the titanium film above the titanium silicide film; implanting impurities serving as donors or acceptors into the titanium silicide film and the silicon film beneath the titanium suicide film by an ion implantation method, said implanting being performed through the titanium nitride film above the titanium silicide film; selectively removing the titanium nitride film above the titanium silicide film and the titanium nitride film located in a region where the titanium silicide film is not formed; and changing the titanium silicide film into a $TiSi_2$ C54 crystal structure which is stoichiometrically stable by a second rapid thermal annealing.

In yet another embodiment of the invention, the method further includes the steps of: removing a native oxide film on the silicon film and then depositing the titanium nitride film on the silicon film without being exposed to atmosphere; performing a first rapid thermal annealing in a nitrogen gas thereby causing the titanium nitride film and the silicon film to react with each other so as to form a titanium silicide film having a $TiSi_2$ C49 crystal structure which is stoichiometrically metastable, and form a titanium nitride film in the surface region of the titanium nitride film above the titanium silicide film; implanting impurities serving as donors or acceptors into the titanium silicide film and the silicon film beneath the titanium suicide film by an ion implantation method, said implanting being performed through the titanium nitride film above the titanium silicide film; selectively removing the titanium nitride film above the titanium silicide film and the titanium nitride film located in a region where the titanium silicide film is not formed; and changing the titanium silicide film into a $TiSi_2$ C54 crystal structure which is stoichiometrically stable by a second, rapid thermal annealing.

In yet another embodiment of the invention, the method further includes the step of: implanting silicon ions in the vicinity of an interface between the titanium film and the silicon film, said implanting of silicon ions being performed after depositing the titanium film and before the first rapid thermal annealing.

In yet another embodiment of the invention, the method further includes the step of: implanting silicon ions in the vicinity of an interface between the titanium nitride film and the silicon film, said implanting of silicon ions being performed after depositing the titanium nitride film and before the first rapid thermal annealing.

In yet another embodiment of the invention, the method further includes the step of providing an oxygen concentration in a total region including the region of the silicon film, a region of the film including a metal corresponding to the region of the silicon film, and an interface of the silicon film and the film including a metal, in which the titanium silicide film is to be formed is $1 \times 10^{18}$ cm$^{-3}$ or less.

In yet another embodiment of the invention, the metal includes a refractory metal.

In yet another embodiment of the invention, the step of reacting the silicon film with the film including a metal comprises a step of annealing the silicon film and the film including a metal.

Thus, the present invention described herein makes possible the advantages of (1) providing a semiconductor device having low sheet resistance such that, with respect to the sheet resistance of the $TiSi_2$ film, the same low value of as that obtained in silicidation of the interconnection with a width larger than the grain size of $TiSi_2$ is obtainable even in silicidation of the interconnection with a width smaller than the grain size, and so heat-resistant that it does not agglomerate even when being annealed in the furnace approximately at 900° C. for 30 minutes; and (2) providing a method for fabricating such a semiconductor device.

These and other advantages of the present invention will become apparent to those skilled in the art upon reading and understanding the following detailed description with reference to the accompanying drawings.

DESCRIPTION OF THE PREFERRED EMBODIMENTS

The examples of the present invention will be described hereinafter, with reference to the accompanying drawings.

In the semiconductor device of the present invention, TiN exists between the crystal grains of the $TiSi_2$ C54 crystal structure. Therefore, the sheet resistance of $TiSi_2$ is lower than that in the case where $SiO_2$ exists between the grains. In particular, with respect to the sheet resistance of the $TiSi_2$ film, the same low value as that in silicidation of the interconnection (e.g., a gate electrode) with a width larger than the grain size of $TiSi_2$ is obtainable in silicidation of the interconnection with a width smaller than the grain size. Furthermore, the surface free energy between $TiSi_2$ and TiN is smaller than that between $TiSi_2$ and $SiO_2$. That is, at a temperature equal to or more than the temperature allowing re-crystallization (about 815° C. in $TiSi_2$), the system works so as to be stabilized by lowering the surface free energy. As a result, the system works so as to decrease the contact area between $TiSi_2$ and $SiO_2$ (the surface free energy between $TiSi_2$ and $SiO_2$ is far larger than that between $TiSi_2$ and Si or the like). Accordingly, in the case where $SiO_2$ exists between the grains of $TiSi_2$ C54 crystals, the film starts to agglomerate at lower temperatures in comparison with the case where TiN exists between the grains. Conversely, the film having a crystal structure where TiN exists between the grains is highly heat-resistant and does not agglomerate even when being annealed in the furnace approximately at 900° C. for 30 minutes.

In the reaction of Ti and Si, there is possibility that oxygen is mixed with the reaction products in the following manners: oxygen included in the underlying silicon substrate to react with a titanium metal or in the silicon film, especially oxygen in the gate electrode formed of a poly-crystalline silicon film deposited by a normal LPCVD silicon deposition device (oxygen atoms more than $1 \times 10^{18} cm^{-3}$ are included in the poly-crystalline silicon film deposited by a normal LPCVD silicon deposition device); oxygen included in the native oxide film existing in the interface between the deposited titanium film and the underlying silicon film or the interface between the deposited titanium film and the silicon substrate and oxygen existing in the deposited titanium metal; oxygen absorbing to the surface of the titanium metal when being open to atmosphere for the first RTA; and oxygen mixed into the atmosphere during the first RTA.

Figure 12A:
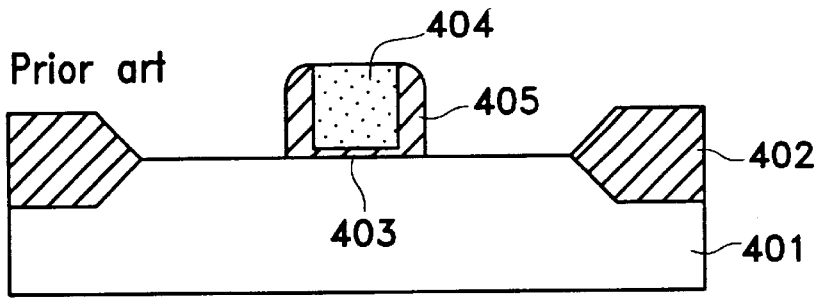
FIGS. 12A through 12E are cross sectional views for explaining a semiconductor device formed by the conventional method.
Figure 12B:
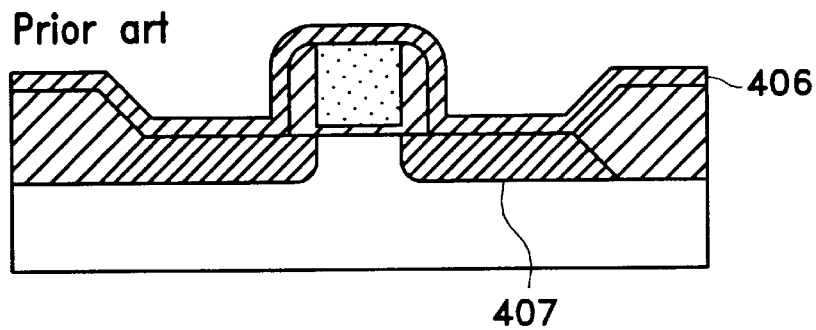
Figure 12C:
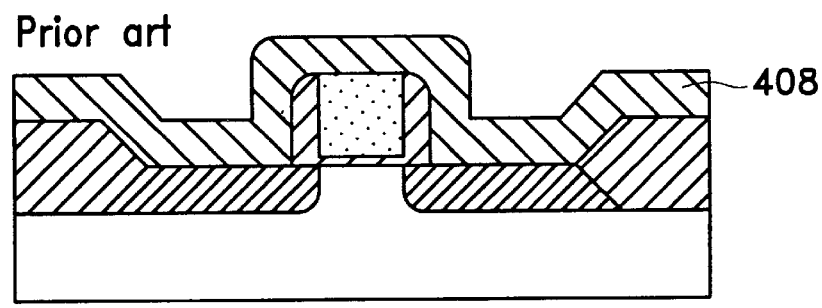
Figure 12D:
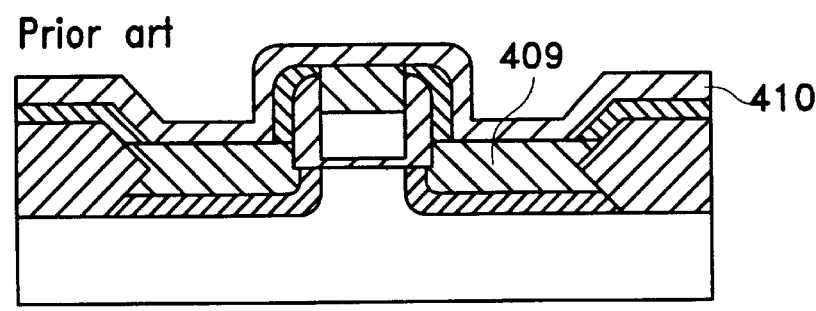
Figure 12E:
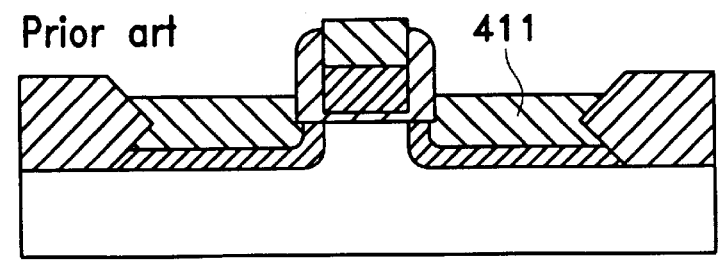

Furthermore, the oxygen knocked on during the ion implantation for forming the source and drain regions in the step as shown in FIG. 12B gets mixed irrespective of the cleanliness of the instrument or gas to be used, and is the most problematic in the conventional technique. The oxide film 406 is indispensable for preventing the contamination at the time of the ion implantation. In particular, in the CMOS process, a mask formed of photoresist is necessary for implanting donors and acceptors separately from each other. The photoresist is applied to the semiconductor substrate through the oxide film 406, since the photoresist to which a heavy metal is mixed at a high ratio cannot be directly applied thereto. Thus, in the conventional technique, mixing of oxygen in the process of reaction of titanium and silicon cannot be prevented.

Table 1 shows generation enthalpies of TiN, $TiO_2$, $SiO_2$ and $TiSi_2$. As is apparent from Table 1, the oxides ($TiO_2$ and $SiO_2$) are most predominantly produced in the quaternary reaction system of Ti, Si, O and N.

TABLE 1

Generation enthalpy of compounds produced among Ti, Si, O and N

| | Generation enthalpy (kJ/mol) |
|---|---|
| $TiO_2$ | −992 |
| $SiO_2$ | −909 |
| TiN | −339 |
| $TiSi_2$ | −134 |

The first RTA should be performed at the lowest possible temperature (575° C. to 650° C.) so that the titanium silicide film grown in the lateral direction may not cause the short between adjacent interconnection (e.g., between the source and the gate, or between the drain and the gate). In the conventional $TiSi_2$ film forming method, the first RTA may result in the silicidation reaction in the ternary system of Ti, Si and O even though it is performed in refined nitrogen gas ambient. As a result, oxides are predominantly formed in the grain boundary of $TiSi_2$. The second RTA should be performed at 800° C. or more in order that the $Tisi_2$ film (basically having a metastable $TiSi_2$ C 49 crystal structure after the first RTA at around 600° C.) including oxides $TiO_2$ and $SiO_2$ is changed into the stable $TiSi_2$ C 54 crystal structure. In the ternary system of Ti, Si and O, the oxide phase which changes into $TiSi_2$ by the annealing at 800° C. or more is only $SiO_2$. Accordingly, only $SiO_2$ exists in the grain. boundary of the $TiSi_2$ film after the second RTA.

The titanium silicide film formed by the conventional method has high sheet resistance and deteriorates in heat-resistant properties. Especially, the degree of rise in the sheet resistance becomes considerably high in silicidation of the interconnection with a width smaller than the grain size of $TiSi_2$ (e.g., a gate electrode). The melting point of $TiSi_2$ (Tm) is 1813 K (=1540° C.). Generally, re-crystallization of metals or the like is prominent at a temperature 0.6 time the melting point (TM) (0.6 Tm=1088 K=815° C.). Hence, by the annealing at 850° C. or more as required for the step of the reflow of the interlevel insulator, the $TiSi_2$ film including $SiO_2$ in the above-mentioned grain boundary starts to agglomerate from $SiO_2$ existing in the grain boundary due to the larger surface free energy difference between $TiSi_2$ and $SiO_2$. The titanium silicide film thus agglomerated is divided into parts, and no more serves as low resistance interconnection layer having silicide. Especially, in silicidation of the interconnection layer with a width smaller than the grain size of $TiSi_2$. (e.g., a gate electrode), the sheet resistance rises to the level as high as that in the interconnection without having a silicide film. Furthermore, since Ti atoms diffuse in silicon in the agglomeration step, the leak current increases due to junction destruction in the source/drain region, while the reliability of the gate oxide film deteriorates in the gate electrode.

EXAMPLE 1

Figure 1A:
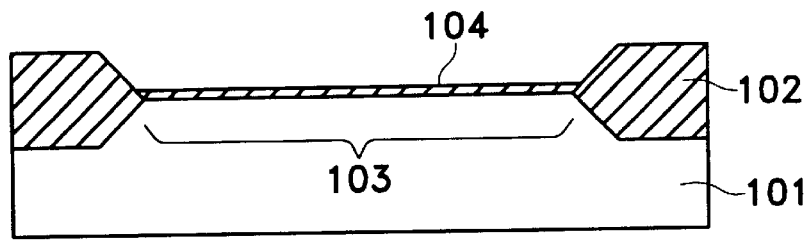
FIGS. 1A through 1E are cross sectional views sequentially showing fabrication steps of a semiconductor device of a first example of the present invention.

First, as shown in FIG. 1A, a field oxide film 102, an active region 103 and a gate oxide film 104 are formed on a semiconductor substrate 101. The semiconductor substrate 101 has been subject to an IG (Intrinsic Gettering) treatment, whereby a DZ (Denuded Zone) zone is formed thereon. The surface region of the substrate has an oxygen concentration of $1 \times 10^{18}$ cm$^{-3}$ or less.

Figure 1B:
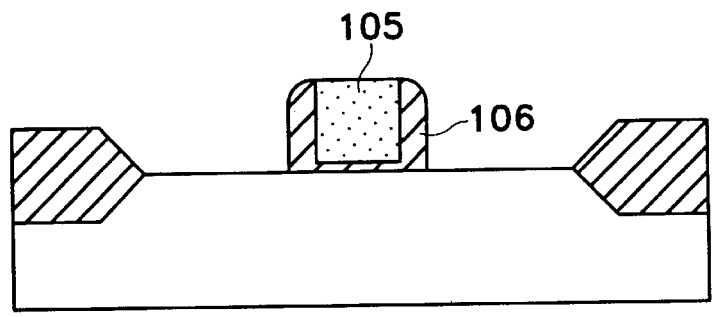
Figure 3:
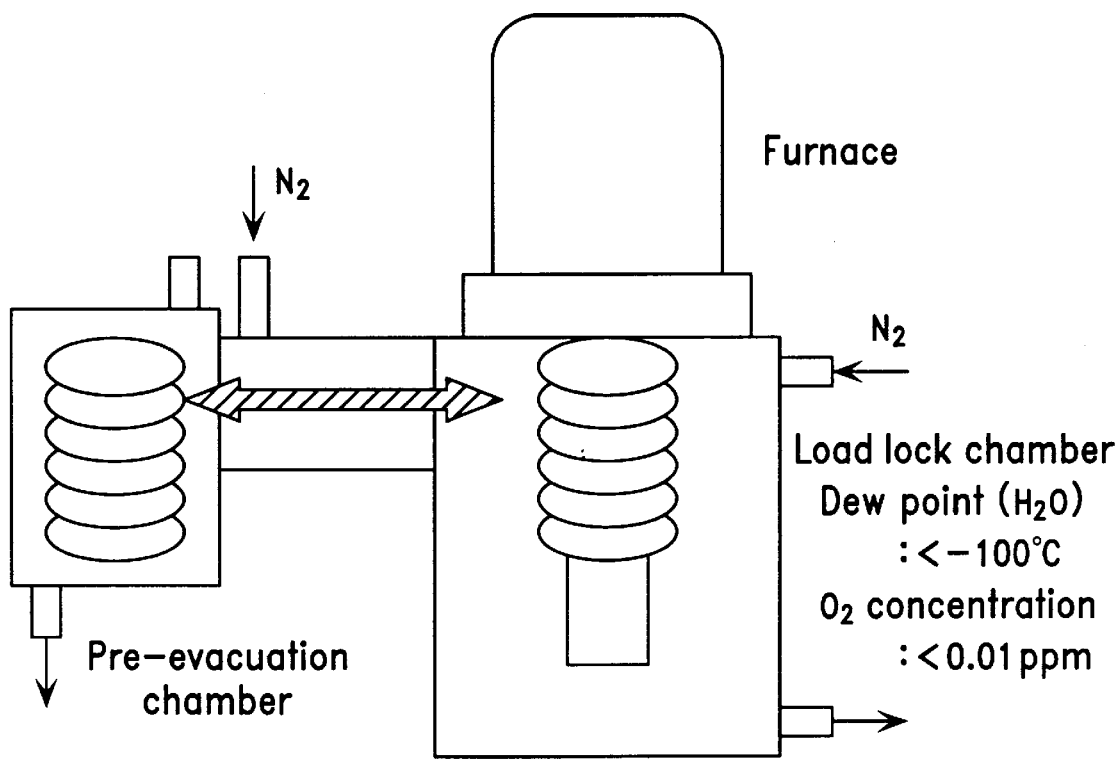
FIG. 3 is a schematic diagram showing a silicon LP-CVD apparatus provided with a load lock chamber used in the present example.

Next, as shown in FIG. 1B, a poly-crystalline silicon film 105 having a thickness of approximately 1500 Å is deposited by using a silicon LP-CVD (Low Pressure Chemical Vapor Deposition) apparatus provided with a pre-evacuation chamber and a load lock chamber purged by using nitrogen and maintained at a dew point of $-100°$ C. or less (see FIG. 3). The deposited film is patterned into a gate electrode, and side wall spacers 106 are formed on the side walls of the gate electrode.

Figure 4:
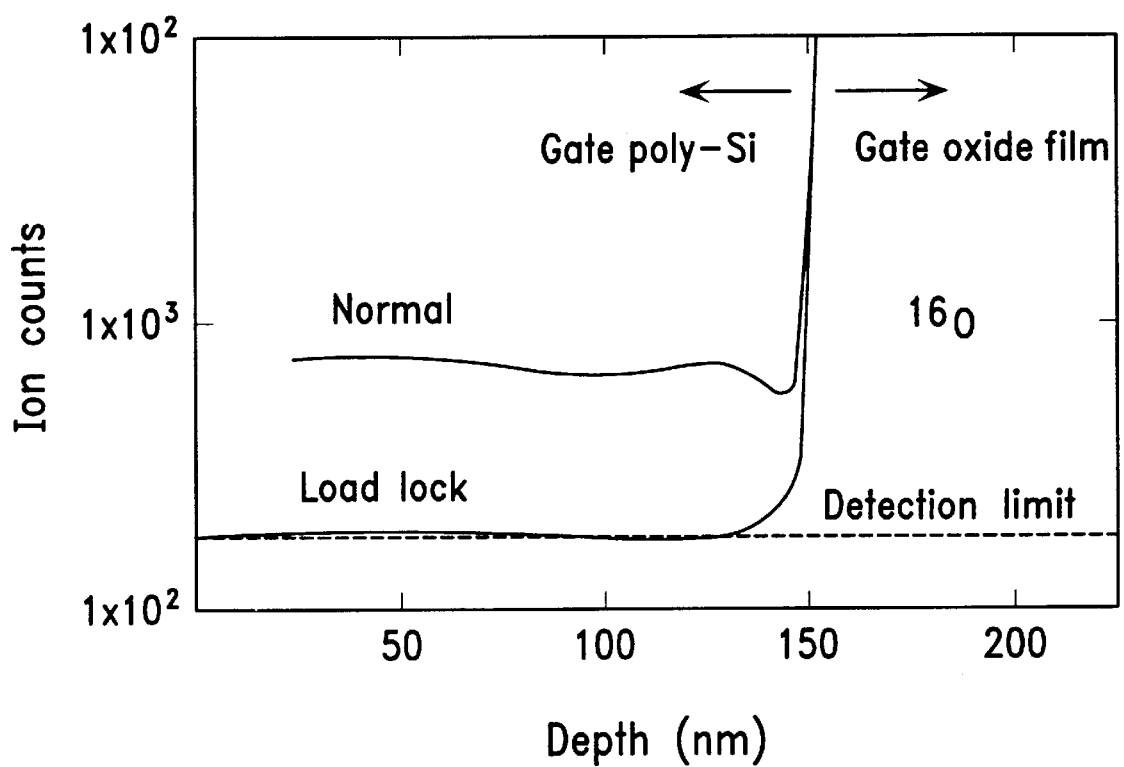
FIG. 4 is a graph showing the result of the SIMS analysis of the oxygen concentration in the silicon film deposited by the silicon LP-CVD apparatus of the present invention provided with a load lock chamber and that in the silicon film deposited by a normal silicon LP-CVD apparatus.

The method for forming the poly-crystalline silicon film 105 by using the apparatus shown in FIG. 3 is described hereinafter. First, a wafer immediately after undergoing the gate oxidation is put into the pre-evacuation chamber, and the pressure of the pre-evacuation chamber is reduced to be about $10^{-1}$ Pa. The wafer is sent to the load lock chamber purged by using nitrogen and maintained at a dew point of $-100°$ C. or less. After $H_2O$ molecules absorbed on the surface of the wafer are removed by the purge using nitrogen, the wafer is sent to the furnace where a poly-crystalline silicon film is formed by an LPCVD method at a pressure of 30 Pa, at a temperature about 620° C. in $SiH_4$ of a degree of purity of 99.9999% or more. As shown in FIG. 4, the concentration of oxygen of the thus formed film is very low, and is equal to or lower than the detection limit ($1 \times 10_{18}$ cm$^{-3}$) according to SIMS (Secondary Ion mass Spectrometry) analysis. In the experiment where the silicide film is formed through the process similar to that of the present example except that the film having a concentration of oxygen of $2 \times 10^{18}$ cm$^{-3}$ is used as the silicon film, a silicide film having heat resistant properties intermediate between the conventional technique and the present invention was obtained.

Figure 1C:
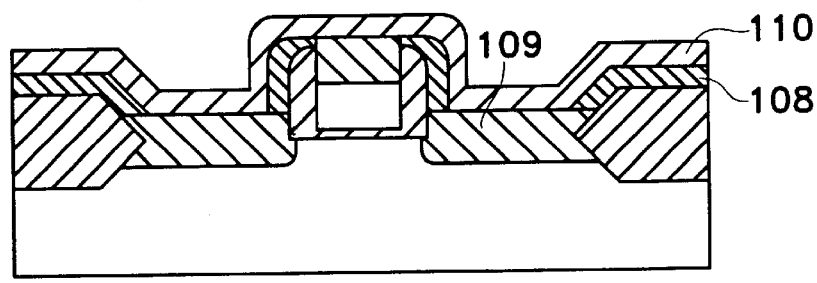

Next, as shown in FIG. 1C, after the native oxide film on the surface of the wafer is removed by using a hydrofluoric type solution, a titanium silicide film 109 having a stoichiometrically metastable $TiSi_2$ C49 crystal structure is formed on the gate electrode 105 and the active region 103 in a self-alignment manner. This is performed by using a cluster type apparatus having a load lock chamber, an etching chamber, a sputtering chamber, an RTA (Rapid Thermal Annealing) chamber and vacuum conveyer chambers for connecting one chamber to another.

Hereinafter, the method for forming the titanium silicide film in the cluster type apparatus will be described in detail.

Figure 2A:
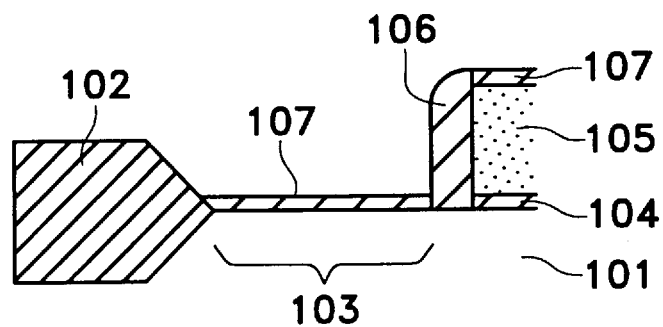
FIGS. 2A through 2C are cross sectional views sequentially showing fabrication steps of the semiconductor device of the first example of the present invention.

First, as shown in FIG. 2A, the wafer is put into the load lock chamber immediately after the native oxide film on the surface of the silicon film (silicon substrate) is removed by using a hydrofluoric acid type solution, and then is conveyed to the etching chamber. A native oxide film 107 and the like, formed again before the wafer is put in the load lock chamber, are removed again for cleaning the surface of the wafer. As a technique for cleaning, an argon sputtering cleaning etching method is employed in the- present example. (Alternatively, the oxide film may be removed by reduction removal, which is realized by providing a hydrogen anneal chamber in place of the etching chamber. In this method, the surface of the substrate is not damaged unlike the method of etching the oxide film by physically sputtering argon atoms. Also, there is another method for removing the oxide film, which is realized by providing an HF gas phase cleaning chamber in place of the etching chamber.

Figure 2B:
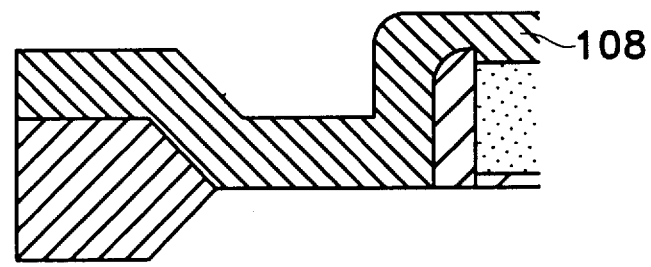

Then, as shown in FIG. 2B, the wafer is conveyed into the sputtering chamber in a vacuum ($1 \times 10^{-8}$ Torr in the present example), where a titanium nitride film 108 of a film thickness about 50 nm is deposited by a reactive sputtering method in a mixture gas of an argon gas and a nitrogen gas at the ratio of nitrogen gas in the range of 0.1% to 10%.

Figure 2C:
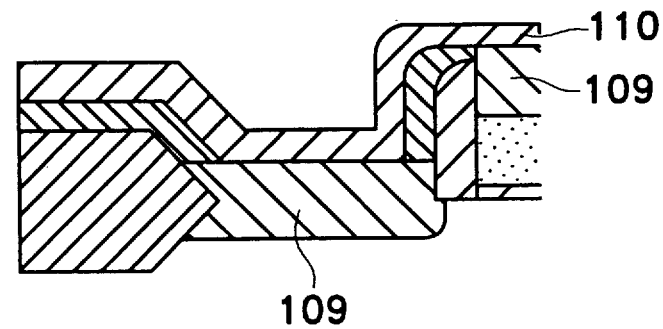

Next, as shown in FIG. 2C, the wafer is conveyed into the RTA chamber in a vacuum ($1 \times 10^{-8}$ Torr in the present example) to be subject to a first RTA for about 20 seconds at temperatures in the range of 575° C. to 650° C. (625° C. in the present example) in nitrogen gas ambient, whereby a titanium silicide-film 109 having a $Tisi_2$ C49 crystal structure is formed on the silicon (103 and 105) due to reaction of titanium and silicon, while the surface region of the deposited titanium nitride film is changed into a titanium nitride film 110 with a higher nitrogen content. Herein, a titanium silicide film is not formed in the region where the silicon film (silicon substrate) is not contact with the titanium silicide film 109 (i.e., the region where the gate electrode side wall spacer 106, the field oxide film 102 and the like are placed) since no silicon is supplied therein. Hence, the titanium silicide film 109 is formed in a self alignment manner only in the regions 103 and 105. Thus, the titanium suicide film formed in the present example has superior heat resistant properties, since TiN exists in the grain boundaries of the film.

Figure 1D:
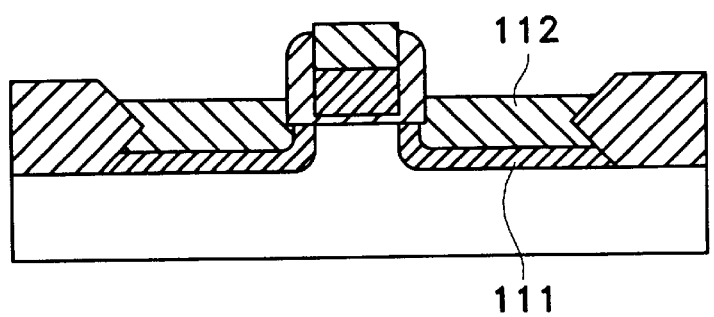

Next, as shown in FIG. 1D, impurity ions to serve as donors or acceptors in silicon are implanted through the titanium nitride film 110 into the titanium silicide film 109 by an ion implantation method. Due to the activation annealing described later, the region where the ions are implanted becomes source/drain regions 111. In the present example, implantation energy is set so as to satisfy the relationship of $T_{TiSi2} \leq Rp + \Delta Rp \leq T_{TiSi2} + T_{TiN}$ where Rp stands for the projected range, $\Delta Rp$ stands for a standard deviation, $T_{TiSi2}$ stands for a thickness of $TiSi_2$ and $T_{TiN}$ stands for a thickness of TiN. In the present example, $^{75}As^4$ and $^{11}B^-$ implanted as donors and acceptors, respectively, at a dose of $5 \times 10^{15}$ cm$^{-2}$. At the same time, they are also implanted into the gate electrode. A transistor of a surface channel type is formed since ions of the same conductivity type as those implanted in the source/drain regions are implanted into the gate electrode.

Next, the titanium nitride films 108 and 110 are removed by selective etching using a mixture solution of a sulfuric acid and a hydrogen peroxide solution from the surface of the titanium silicide film 109, the field oxide film 102 and the gate electrode side wall spacer 106. Thereafter, a second RTA at a temperature of about 800° C. to 1100° C. is performed so as to form a titanium silicide film 112 having a stoichiometrically stable $TiSi_2$ C54 crystal structure. In the present example, a furnace annealing step which will be described later is performed for the reflow of the interlevel insulator on the titanium silicide film, Hence, the activation annealing of the donors or the acceptors can be simultaneously performed by the furnace annealing step described later. In the present example, the second RTA is performed at 900° C. for about 20 seconds in $N_2$ gas. However, in the case of not performing the furnace annealing step, the second RTA may be performed at a temperature of 1000° C. to 1100° C. also for the activation annealing of the donors or the acceptors.

Figure 5:
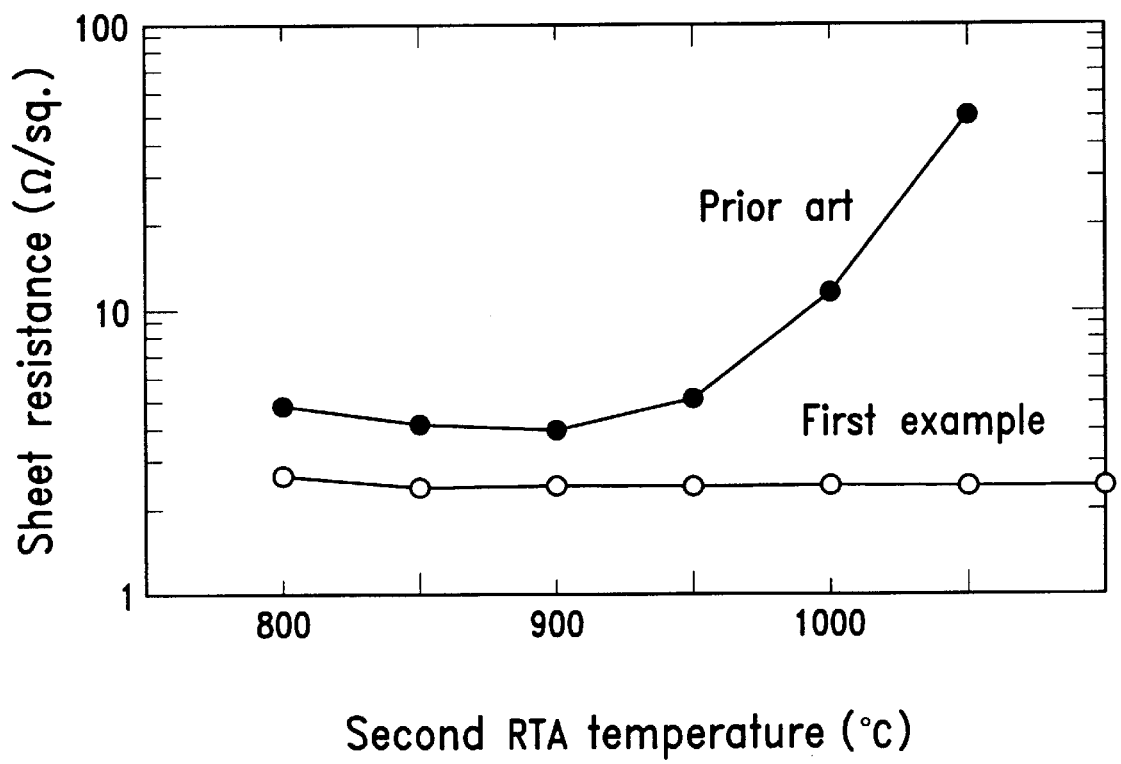
FIG. 5 is a graph showing the dependency of the sheet resistance on the temperature of the second RTA, in the titanium silicide film formed on the silicon film of a first example of the present invention deposited by the silicon LP-CVD apparatus of the present invention provided with a load lock chamber and in the titanium silicide film formed on the silicon film deposited by the normal silicon LP-CVD apparatus of the conventional method.

The suicide film in the present example is formed by silicidation reaction from which oxygen is excluded, and TiN exists in the grain boundaries of the formed silicide film. Hence, the silicide film of the present example has heat-resistant properties superior to those obtained by the conventional method. As shown in FIG. 5, the rise in the sheet resistance due to the agglomeration can be eliminated in the RTA at about 1100° C. for approximately 20 seconds.

Figure 1E:
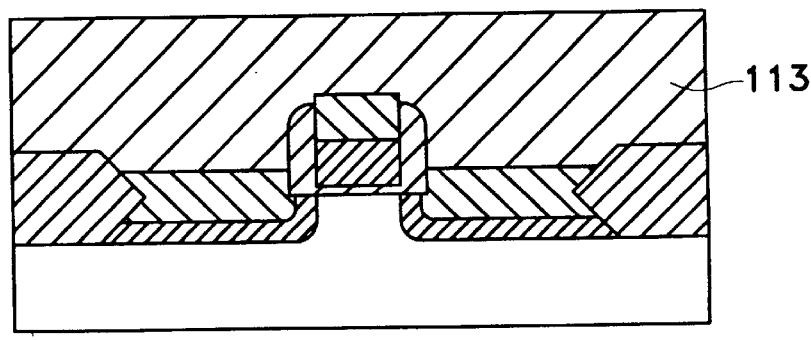

Next, as shown in FIG. 1E, an interlevel insulator 113 is deposited, and furnace annealing is performed for about 10 minutes at 900° C. in $N_2$ gas both for making the upper face of the interlevel insulator as flat as possible (reflow) and for the activation annealing of implanted impurities. Thereafter, a desired semiconductor device is fabricated through a contact formation step and a metallization step (not shown).

Figure 6A:
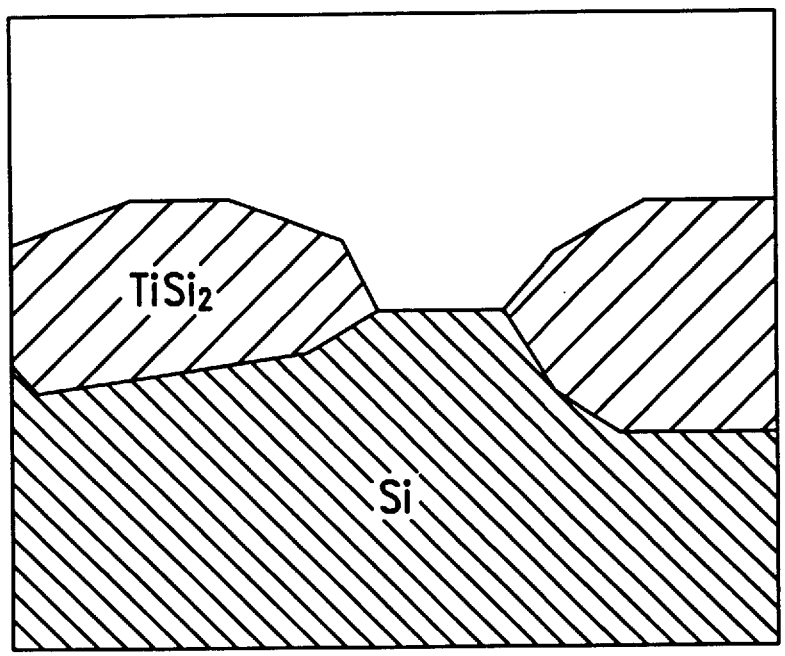
FIG. 6A is a cross sectional view schematically showing the titanium silicide film formed by the conventional method, after being annealed at 900° C. for 30 minutes in nitrogen gas ambient.
Figure 6B:
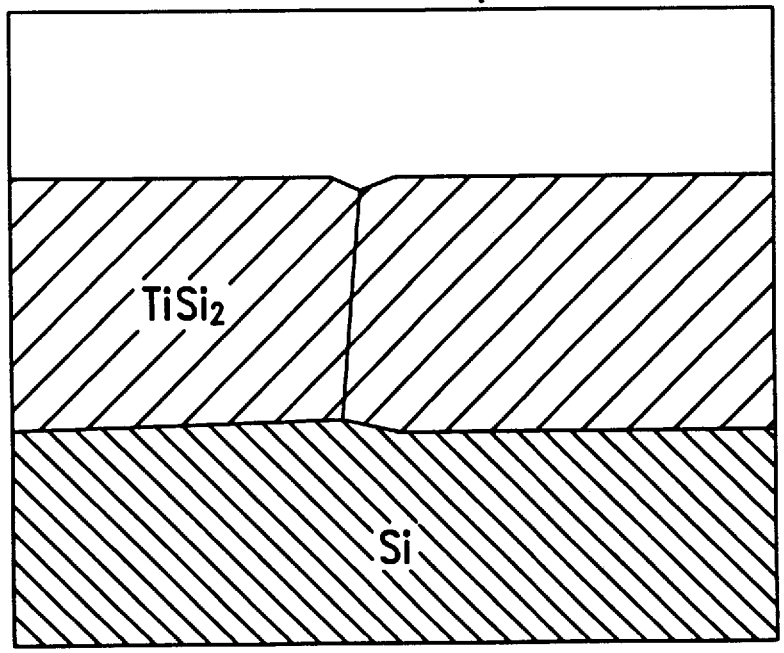
FIG. 6B is a cross sectional view schematically showing the titanium silicide film formed in the first example of the present invention, after being annealed at 900° C. for 30 minutes in nitrogen gas ambient.

FIG. 6 is a cross sectional view based on TEM (transmission electron microscope) photographs, showing the shape of the titanium silicide film of the present example and that of the conventional method, after being annealed at 900° C. in $N_2$ gas for 30 minutes. It revealed that the silicide film of the present example, subject to the annealing at 900° C. in $N_2$ for about 30 minutes, did not agglomerate.

The titanium silicide film formed by the present example has superior heat-resistant properties. This phenomenon will be described by using a model shown in FIG. 7. The surface free energy between $TiSi_2$ and TiN is smaller than that between $TiSi_2$ and $SiO_2$. Namely, at temperatures higher than the re-crystallization point (about 815° C. in $TiSi_2$), the system works so as to lower the surface free energy for obtaining a more stable state. In this case, the system works so as to reduce the contact area between $TiSi_2$ and $SiO_2$ since the surface free energy between $TiSi_2$ and Si is small. The surface free energy between $TiSi_2$ and TiN is smaller than that between $TiSi_2$ and $SiO_2$. Namely, agglomeration starts at a lower temperature in the film in which $SiO_2$ exists between $TiSi_2$ C54 crystal grains, in comparison with the film in which TiN exists between crystal grains. Conversely, the film in which TiN exists between crystal grains is highly heat-resistant and does not agglomerate even if being subject to the furnace annealing at 900° C. for about 30 minutes.

Figure 8:
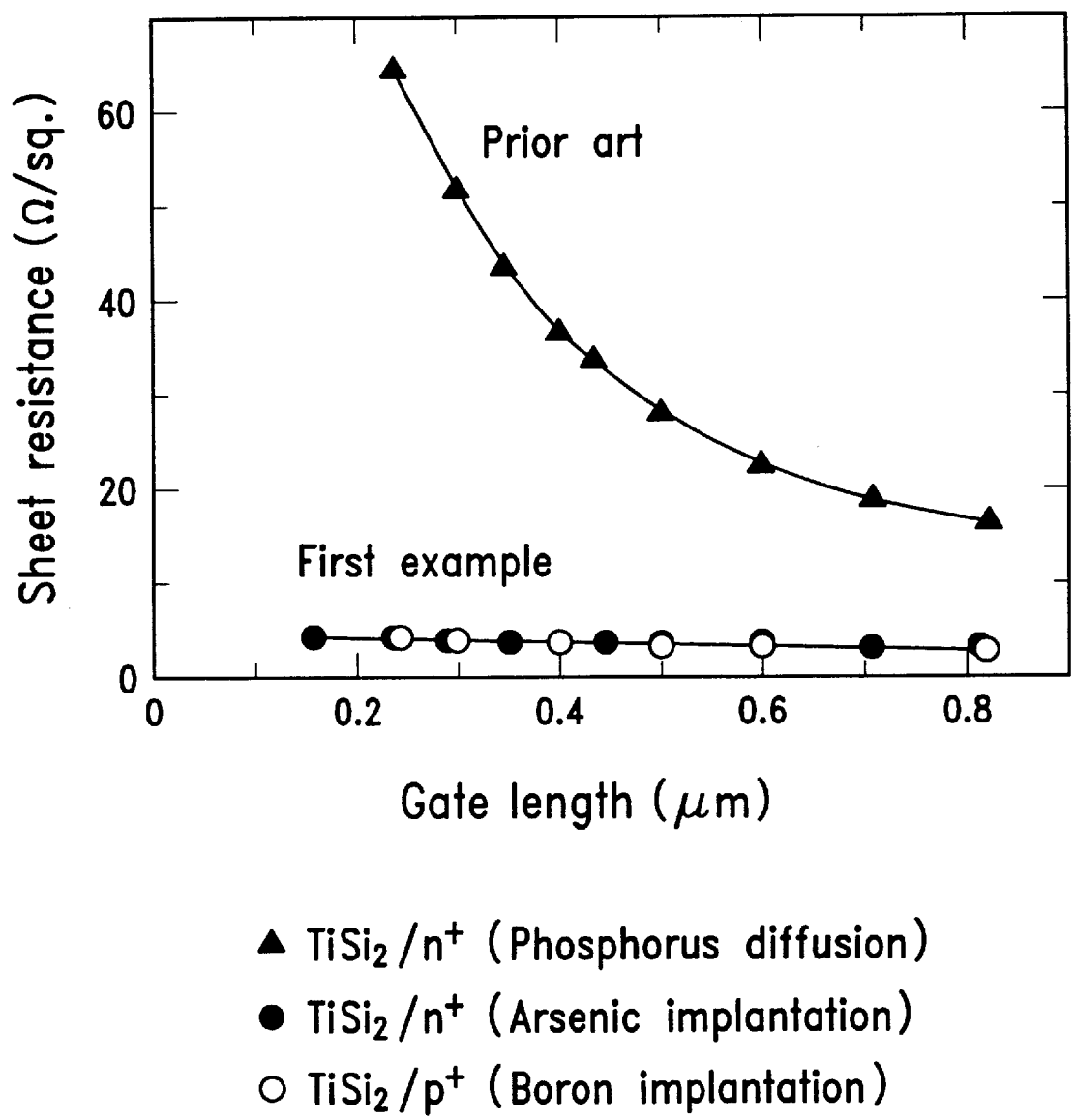
FIG. 8 is graph showing the dependency of the sheet resistance on the gate length of the gate electrode having the titanium silicide film formed in the first example of the present invention and that of the gate electrode having the titanium silicide film formed by the conventional method.

FIG. 8 shows the dependency of the sheet resistance on the gate length in the gate electrode having the titanium silicide film formed in the present example and that in the gate electrode having the titanium silicide film formed by the conventional method. It was confirmed that the interconnection sheet resistance did not rise at the gate length of 0.2 $\mu$m or more in both of $n^+$ and $p^-$ gate electrodes. In addition, it was confirmed that the value of the sheet resistance was far lower than that of the conventional method.

Figure 9:
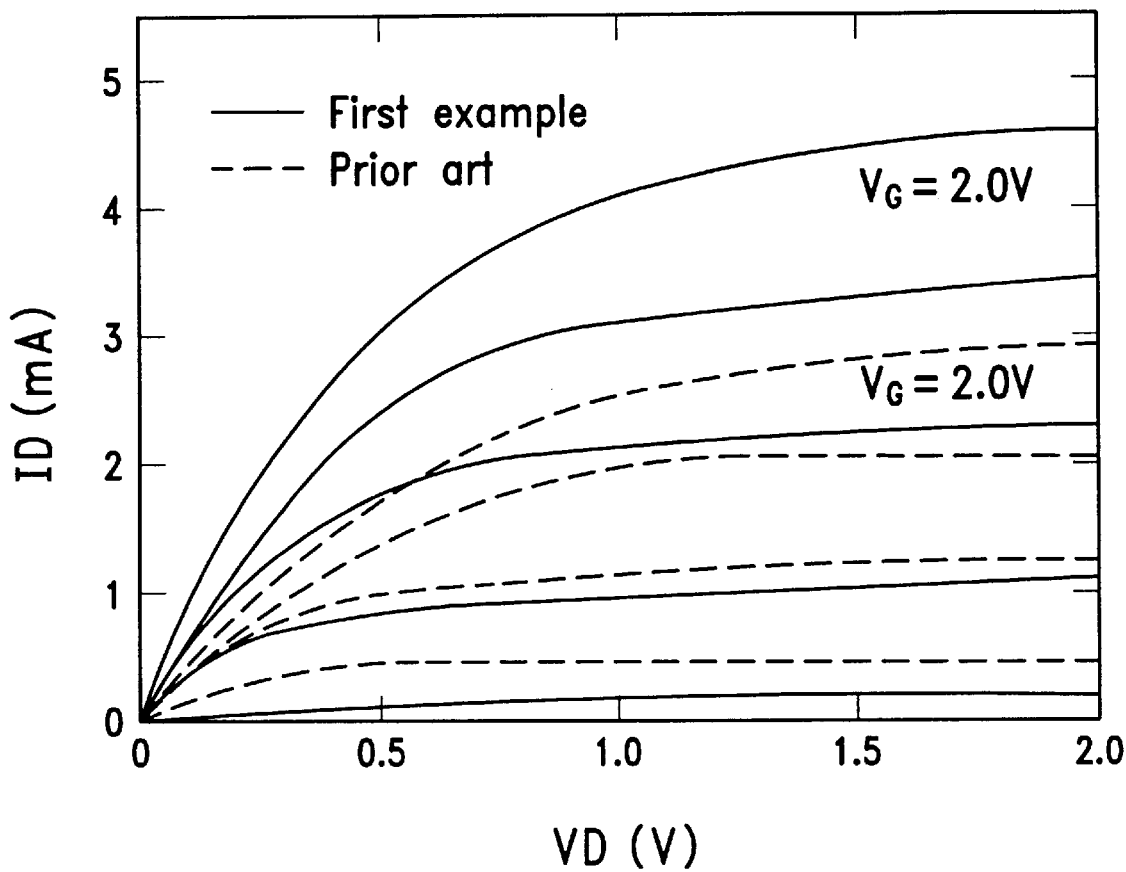
FIG. 9 shows ID–VD characteristics of an LDD transistor having the titanium silicide film formed in the first example and those of an LDD transistor having the titanium silicide film formed by the conventional method.

FIG. 9 and Table 2 show the characteristics of an LDD transistor having the titanium suicide film of the first example in the source/drain and gate regions and those of an LDD transistor having, the titanium silicide film formed by the conventional method shown in FIG. 12 in the source/drain and gate regions. In the transistor of the present example, the film thickness of the gate oxide film is about 5 nm, the film thickness of the gate electrode side wall spacer is about 100 nm, and the gate length is about 0.26 $\mu$m both for the conventional method and the present invention.

FIG. 9 shows ID–VD characteristics of the LDD transistor having the titanium silicide film of the present example and those of the LDD transistor having the titanium silicide film formed by the conventional method. It was confirmed that the current drivability (mutual conductance) of the present invention was improved by 50% in comparison with that of the conventional method.

Table 2 shows the trans-conductance (gml) in the linear region, the trans-conductance (gms) in the saturation region, and the transistor series resistance having the titanium silicide film of the present example and having the titanium suicide film formed by the conventional method. By the present invention, the trans-conductance in the linear region and the trans-conductance in the saturation region re improved by about 45% in comparison with those of the conventional method. Furthermore, the series resistance is reduced to half or less.

TABLE 2

|  | Conventional method | First example of the present invention |
| --- | --- | --- |
| gm (linear region) | 51.4 $\mu S/\mu m$ | 73.7 $\mu S/\mu m$ |
| gm (saturation region) | 207.5 $\mu S/\mu m$ | 302.1 $\mu S/\mu m$ |
| Series resistance | 1252.5 $\Omega \mu m$ | 576.5 $\Omega \mu m$ |

Gate length: 0.26 $\mu$m
Gate oxide film thickness: 5 nm
Gate side wall film thickness: 100 nm

EXAMPLE 2

FIGS. 10A to 10D are cross sectional views showing the fabrication steps of the present invention.

Figure 10A:
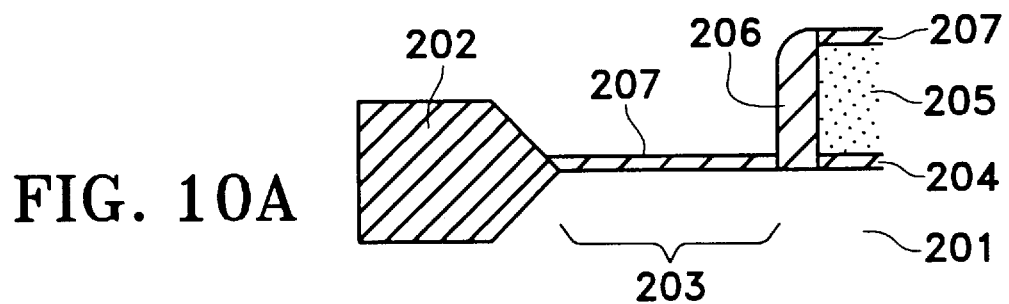
FIGS. 10A through 10D are cross sectional views sequentially showing fabrication steps of a semiconductor device of a second example of the present invention.

First, a field oxide film 202, an active region 203, a gate oxide film 204, a gate electrode 205 and a side wall spacer 206 are formed on a semiconductor substrate 201 having been subject to an IG treatment, in the same manner as that for the process until the step shown in FIG. 13 of the first example. Then, the wafer is put in the load lock chamber of the cluster type apparatus used in the first example, immediately after the native oxide film on the surface of the silicon films 201 and 205 is removed by using A hydrofluoric type solution as shown in FIG. 10A. Thereafter, the wafer is conveyed into the etching chamber, and a native oxide film 207 and the like, formed again before the wafer is put in the load look chamber, are removed again for cleaning the surface of the wafer. As a technique for cleaning, an argon sputtering cleaning etching method is employed in the present example. (Alternatively, the oxide film may be removed by reduction removal, which is realized by providing a hydrogen anneal chamber in place of the etching chamber. In this method, the surface of the substrate is not damaged unlike the method of etching the oxide film by physically sputtering argon atoms. Also, there is another method for removing the oxide film, which is realized by providing a HF gas phase cleaning chamber in place of the etching chamber.)

Figure 10B:
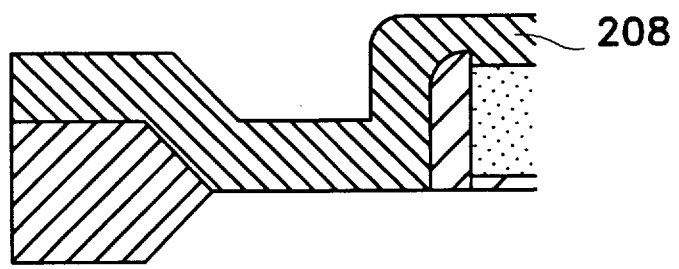

Then, as shown in FIG. 10B, the wafer is conveyed into the sputtering chamber in a vacuum ($1 \times 10^{-8}$ Torr in the second example), where a titanium nitride film 208 is deposited by a reactive sputtering method in a mixture gas of an argon gas and a nitrogen gas at the ratio of nitrogen gas in the range of 0.1% to 10% (nitrogen gas of 1%, in the second example).

Figure 10C:
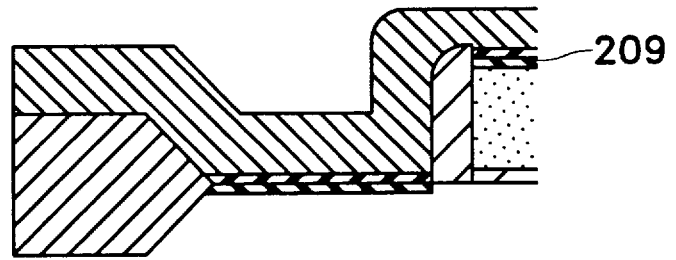

Next, as shown in FIG. 10C, the wafer is taken out of the cluster apparatus, and silicon ions are implanted. The implantation energy is set so as to satisfy the relationship of $Rp=T_{TiN}$ where Rp stands for the projected range and $T_{TiN}$ stands for the thickness of the titanium nitride film. In the second example, the silicon ions are implanted at a dose of $5\times10^{15}$ cm$^{-2}$. Due to this silicon ion implantation, a layer 209 in which titanium (i.e., titanium containing nitrogen) and silicon are mixed with each other is formed in the interface between the titanium nitride film 208 and the silicon (203 and 205). Hence, the surface morphology of the titanium nitride film becomes very smooth after the RTA step which will be described later. In the second example, since the ion implantation apparatus and the sputtering apparatus are not connected via a vacuum conveyance system, the wafer is once exposed to atmosphere after the deposition of the titanium nitride film. This is preferably performed in the cluster type apparatus in which the sputtering chamber and the ion implantation chamber are connected via the vacuum conveyance system.

Figure 10D:
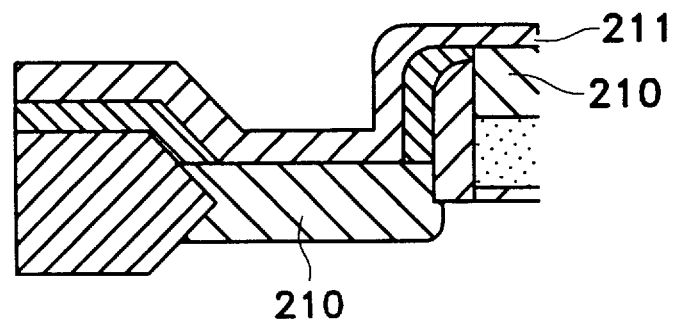

Next, as shown in FIG. 10D, a first RTA for about 20 seconds is performed at a temperature in the range of 575° C. to 650° C. (625° C. in the second example) in nitrogen gas ambient, whereby a titanium silicide film 210 having a TiSi$_2$ C49 crystal structure which is stoichiometrically metastable is formed on the silicon (203 and 205) due to reaction of titanium and silicon, while the surface region of the deposited titanium nitride film is changed into a titanium nitride film 210 with a higher nitrogen content. Herein, a titanium silicide film is not formed in the region where the silicon film (silicon substrate) is not contact with the titanium silicide film 210 (i.e., the region where the gate electrode side wall spacer 206, the field oxide film 202 and the like are placed), since no silicon is supplied therein. Hence, the titanium suicide film 210 is formed in a self alignment manner only in the regions (203 and 205). In the titanium silicide film formed in the second example, TiN exists in the grain boundary, and the surface morphology is very smooth. Moreover, the thus formed titanium silicide film has superior heat resistant properties.

Thereafter, a desired semiconductor device is obtained through the same process as that of the first example following the step shown in FIG. 1D.

EXAMPLE 3

In the first and second examples, the gate electrode is obtained by depositing a poly-crystalline silicon film and patterning it. However, the gate electrode may be formed of an amorphous silicon film in place of the poly-crystalline silicon film. In this case, a silicon LP-CVD apparatus having a pre-evacuation chamber and a load lock chamber purged by using nitrogen end maintained at a dew point of −100° C. or less. The semiconductor wafer immediately after the formation of the gate oxide film is conveyed into the pre-evacuation chamber, and the pressure of the pre-evacuation chamber is reduced to be about $10^{-1}$ Pa. The wafer is sent to the load lock chamber purged by using nitrogen and maintained at a dew point of −100° C. or less. After H$_2$O molecules absorbed on the surface of the wafer are removed by the purge using nitrogen, the wafer is sent to the furnace where an amorphous silicon film of about 1500 Å is formed by an LPCVD method at a pressure of 50 Pa and a temperature about 550° C. in the ambient of SiH$_4$ of a degree of purity of 99.9999% or more. The concentration of oxygen of the thus formed film is very low, which is $1\times10^{18}$ cm$^{-3}$ or less. Following this, a semiconductor device is fabricated through the process steps similar to those of the first and second examples. Alternatively, a two-layered film in which an amorphous silicon film is deposited on the poly-crystalline silicon film may be used as the gate electrode. The two-layered film may be formed in the following manner. A poly-crystalline silicon film is deposited to the thickness of 1000 Å by the method (process sequence) of the first example. Then, the sequence is continuously changed into the conditions for depositing an amorphous silicon film without exposing the wafer to atmosphere, so as to deposit amorphous silicon having a thickness of about 500 Å. The oxygen concentration of the thus formed two-layer film is very low, which is $1\times10^{18}$ cm$^{-3}$ or less. An amorphous silicon film has no grain boundary as existing in the poly-crystalline silicon film. Hence, in the case where the film to react with the titanium nitride film is an amorphous silicon film, a titanium silicide film having an excellent surface morphology can be formed.

EXAMPLE 4

The present invention is not limited to the silicide transistor having a normal structure, which has been described in the first through third examples. For example, before forming the gate side wall spacer, an implantation region with a low level of ion concentration may be formed for the LDD transistor by using the gate electrode as a mask. (For example, in the case of NMOS, phosphorous ions are implanted at a dose of about $3\times10^{13}$ cm$^2$). Alternatively, arsenic ions may be implanted in place of phosphorous ions At a dose amount of about $1\times10^{14}$ cm$^2$ for the purpose of local extended junction. (Our experiment revealed that there was little influence of knocked on oxygen on the silicidation reaction in the arsenic ion implantation at an order of the 14th power).

Figure 11A:
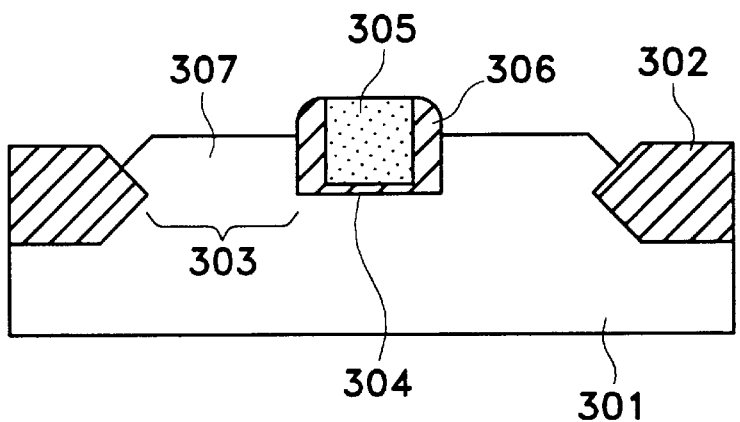
FIGS. 11A and 11B are cross sectional views showing a semiconductor device of a fourth example of the present invention.
Figure 11B:
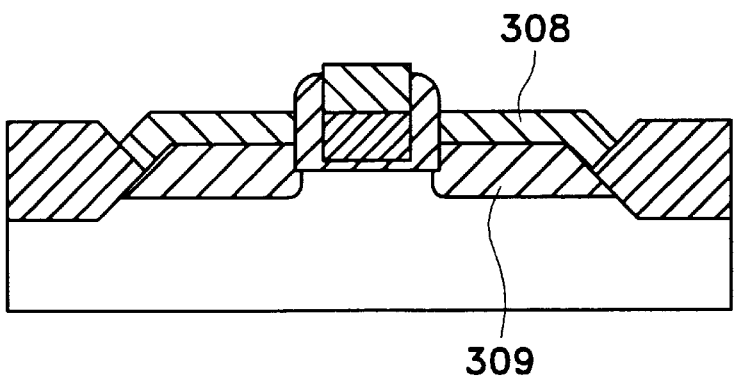

The present invention can also be applied to the transistor of the type having a stacked diffusion layer as shown in FIGS. 11A and 11B. First, as shown in FIG. 11A, a field oxide film 302, an active region 303, a gate oxide film 304, a gate electrode 305 and a side wall spacer 306 are formed on a semiconductor substrate 301. The gate electrode 305 is formed of a poly-crystalline silicon film, an amorphous silicon film or a two-layered film composed of a poly-crystalline silicon film and an amorphous silicon film such that the oxygen concentration becomes $1\times10^{18}$ cm$^{-3}$ or less, in the manner similar to that of the first through third examples. Thereafter, a single-crystalline silicon film or a non-single-crystalline silicon film such that the oxygen concentration becomes $1\times10^{18}$ cm$^{-3}$ or less is selectively grown on the active region so as to grow a stacked silicon region 307.

A technique for conducting the selective growth includes following methods:

a selective epitaxial growth method;

a method using a silicon LP-CVD apparatus described in the first through third examples of the present invention, having a pre-evacuation chamber and a load lock chamber purged by using nitrogen and maintained at a dew point of −100 ° C. or less, in which an epitaxial growth in accordance with the crystal orientation of an underlying crystal substrate is performed in the active region, while a film such that it causes a poly-crystalline silicon film (in the case of film formation at 590° C. or more) or an amorphous silicon film (in the case of film formation at 590° C. or less) to be deposited is deposited in the region where the silicon substrate is not exposed, and then the poly-crystalline silicon film or the amorphous silicon film is removed by selective etching so as to selectively grow a silicon film on the active region;

a method using the above-mentioned silicon LP-CVD apparatus, in which an epitaxial growth in accordance with the crystal orientation of an underlying crystal substrate is performed in the active region, while, in the region where the silicon substrate is not exposed, a film such that it causes a poly-crystalline silicon film or an amorphous silicon film is deposited, or a polycrystalline silicon film or an amorphous silicon film is deposited over the entire face of the wafer, and thereafter the poly-crystalline silicon film or the amorphous silicon film is polished by a chemical and mechanical polishing method until the top of the gate electrode is exposed, and then is patterned in the field region.

Next, as shown in FIG. 11B, the gate electrode and source/drain regions 309 both having titanium silicide films as backing layers are formed by the method of the first or second example. In the transistor of the third example, the source/drain regions are grown to be higher than the gate channel region. This makes the transistor less affected by the short channel effects.

As is apparent from the foregoing descriptions, in the present invention, oxygen is excluded in the silicidation reaction, and a titanium silicide film is formed by causing a titanium nitride film instead of a Ti metal to react with silicon. Hence, TiN in place of $SiO_2$ exists in the grain boundaries of the $TiSi_2$. The sheet resistance of the thus formed $TiSi_2$ film is low. Especially, unlike the conventional method, the interconnection resistivity in silicidation of the interconnection with a width less than the grain size of the $TiSi_2$ film is not far larger than in silicidation of the interconnection with a width more than the grain size of the $TiSi_2$ film. Hence, with respect to the sheet resistance of the $TiSi_2$ film, the same low value as that obtained in silicidation of the interconnection with a width larger than the grain size is advantageously obtainable in silicidation of the interconnection with a width less than the grain size of the $TiSi_2$ film.

Moreover, due to the high heat-resistant properties, the film is advantageously free from the agglomeration even if the annealing for activation of implanted donors or acceptors or the annealing for the reflow of the interlevel insulator is performed in the furnace annealing at 900° C. and for approximately 30 minutes after the silicide film formation.

Consequently, it is possible to prevent re-diffusion of titanium accompanying re-crystallization of titanium silicide. Moreover, the leak current from the junction of the source and drain regions does not increase in comparison with the case of the device without silicide film. The reliability of the gate oxide film can be assured similar to the device without silicide film.

Furthermore, since the impurities are implanted after the silicide film formation, the damage due to the implantation scarcely reach the silicon film (silicon substrate) below the silicide film. Hence, it becomes possible to prevent the enhanced diffusion caused by the activation annealing as well as to perform the impurities activation annealing and the annealing for the reflow of the interlevel insulator at the same time. This allows simplification of the fabrication process and reduction of the total amount of annealing, and facilitates fabrication of the transistor less affected by the short channel effects.

EXAMPLE 5

A silicidation reaction performed in a system where oxygen is removed as much as possible is illustrated in the following as Example 5. As described In the preceding examples, the oxygen concentration in the surface region of the semiconductor substrate which becomes the source/drain region is kept at or below $1 \times 10^{18}$ cm$^{-3}$ by performing IG treatment and by forming the DZ zone. Moreover, the oxygen concentration in the poly-crystalline silicon film which becomes the gate electrode is kept at an extremely low level by depositing the film using the above-mentioned silicon LPCVD deposition device including the load lock chamber (FIG. 4).

Even for a poly-crystalline silicon film (silicon substrate surface) having an extremely low concentration of oxygen as such, an oxide film is natively formed on the surface of the poly-crystalline silicon film (silicon substrate) at the moment when surface is exposed to an atmosphere. That is, even though the surface of the poly-crystalline silicon film (silicon substrate) is cleaned (the cleaning process including the removal of the oxide film by etching) with a hydrofluoric acid-based solution before depositing a titanium (titanium nitride) film for silicidation, if the wafer is carried through an atmosphere to the device for depositing titanium (titanium nitride), a new native oxide film is formed on the surface of the poly-crystalline film (silicon substrate), thereby creating a situation where oxygen (the oxide film) exists at the interface between the titanium (titanium nitride) film to be deposited in the next step and the poly-crystalline silicon film (silicon substrate).

In order to resolve the situation, in the present example, after removing the native oxide film on the wafer surface by the hydrofluoric acid-based solution as illustrated in the above-described example, a titanium (titanium nitride) film is deposited in a cluster-type apparatus including a load look chamber, an. etching chamber, a sputtering chamber and a rapid thermal annealing (RTA) chamber, which are all connected by vacuum conveyers.

The titanium silicide film is formed in the cluster-type apparatus as follows. First, a wafer, immediately after the removal of the native oxide film from the wafer surface by a hydrofluoric acid-based solution, is placed inside the load lock chamber. Then, the wafer is conveyed to the etching chamber where the native oxide film formed during the time interval between the removal of initially formed native oxide film on the wafer surface and its placement in the load lock chamber is removed by a hydrofluoric acid-based-solution, thereby cleaning the wafer surface. Then, a titanium (titanium nitride) film is deposited in an argon ambient by sputtering, after which the silicidation reaction takes place.

The method of cleaning the wafer is to perform a chemical plasma etching by a fluorine-based gas such as $CF_4$, $C_4F_6$, $NF_3$, etc. added with a reducing gas such as $H_2O/H_2$, etc., thereby removing the oxide film. Other methods include argon sputtering etching, reduction and removal of the oxide film in a hydrogen annealing chamber provided in place of the etching chamber, and the like. Also available is a method where an HF vapor washing chamber is provided and a method where the titanium (titanium nitride) film is deposited as follows. First, the native oxide film is removed in a wet washing chamber (a native oxide film removing chamber using a hydrofluoric acid-based solution) which is connected to the cluster-type apparatus via the load lock chamber and whose environment is controlled under the inert gas environment or the nitrogen gas environment. then, without exposing the wafer to an atmosphere, the wafer is conveyed to the load lock chamber and, after vacuum is drawn, to the sputtering chamber where the titanium (titanium nitride) film is deposited.

As described above, the important point in the silicidation reaction is that the oxygen concentration in the region where the silicidation reaction takes place is $1 \times 10^{18}$ cm$^{-3}$ or less, thereby improving both the sheet resistance and the heat-resistance substantially. Of course, the higher the purity of the titanium target in the sputtering chamber is, the better the result. In our experiment, a target having a purity of 99.9999% was used.

In order to initiate the silicidation reaction in the present example, the native oxide film on the surface of the poly-crystalline silicon film (silicon substrate) is removed, and then, instead of depositing a TiN film which is rich in titanium in the previous examples, a pure titanium film is deposited by the above-mentioned method. Then, the silicidation reaction is initiated by the two-step rapid thermal annealing (2-step RTA) as in the previous examples.

Figure 13B:
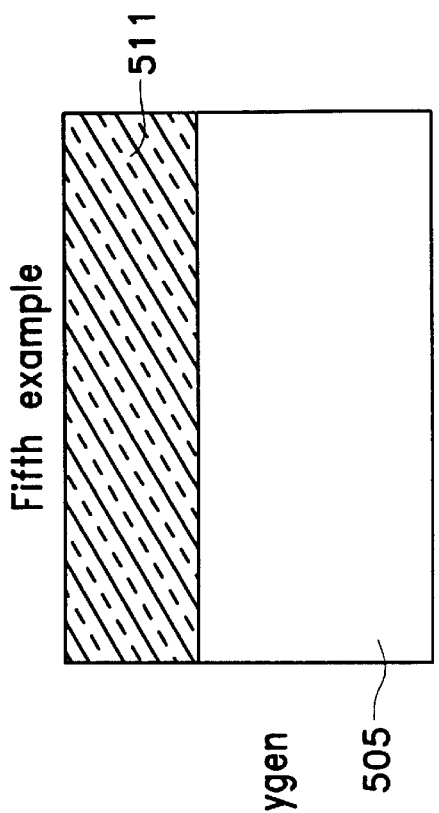
FIGS. 13A to 13D are cross sectional views of the wafer in the conventional method and the present invention, respectively, after the first step of the rapid thermal annealing (1st Step RTA) is performed.
Figure 13A:
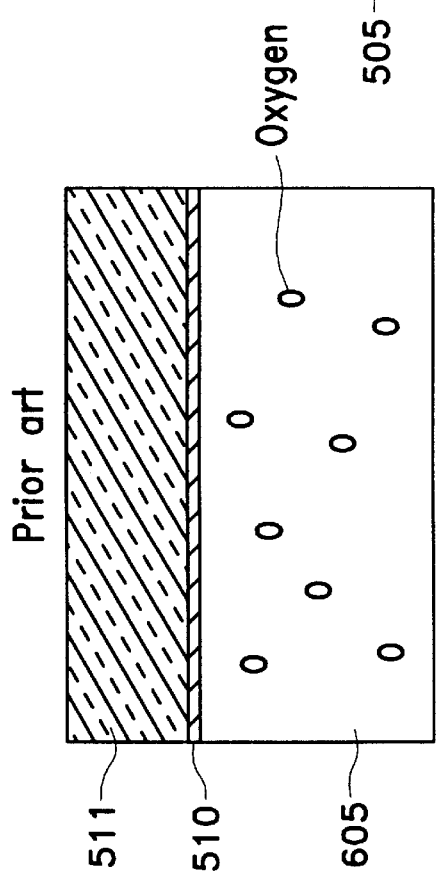
Figure 13D:
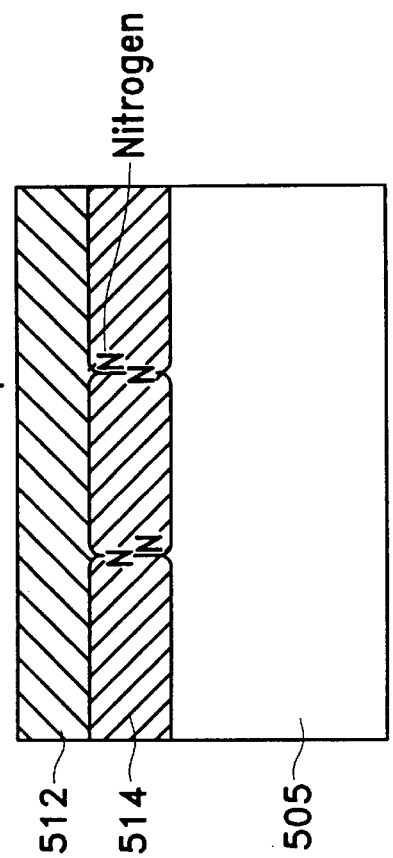
Figure 13C:
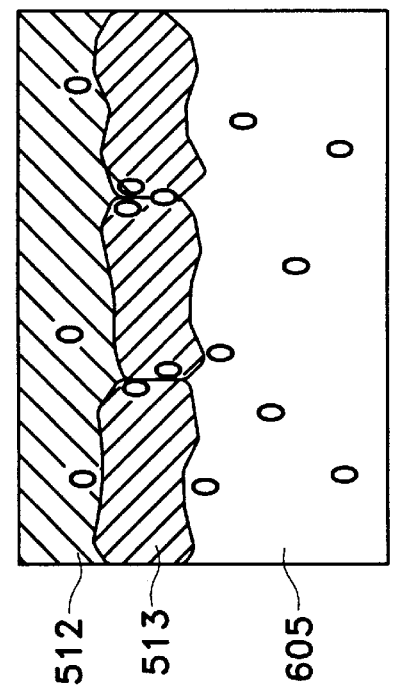
Figure 14A:
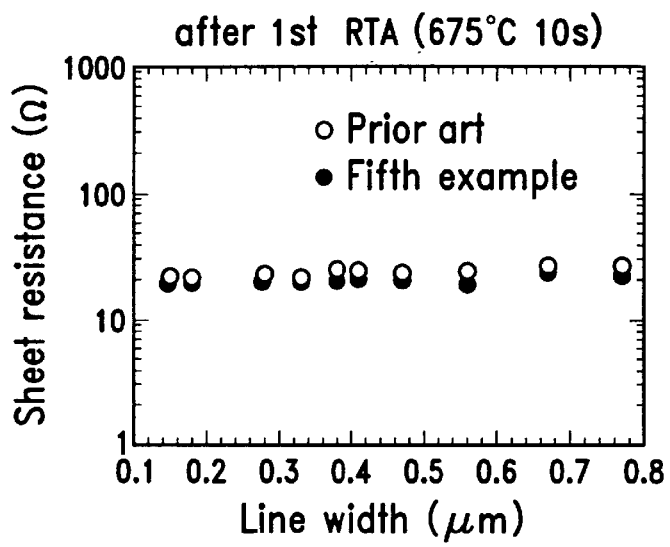
FIGS. 14A to 14I are graphs illustrating the line width dependence of the sheet resistances of the titanium silicide films formed by the present example and the conventional method.
Figure 14B:
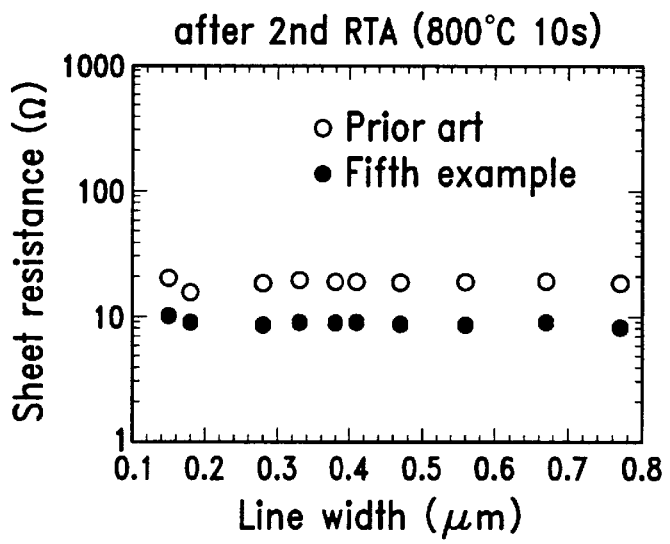
Figure 14C:
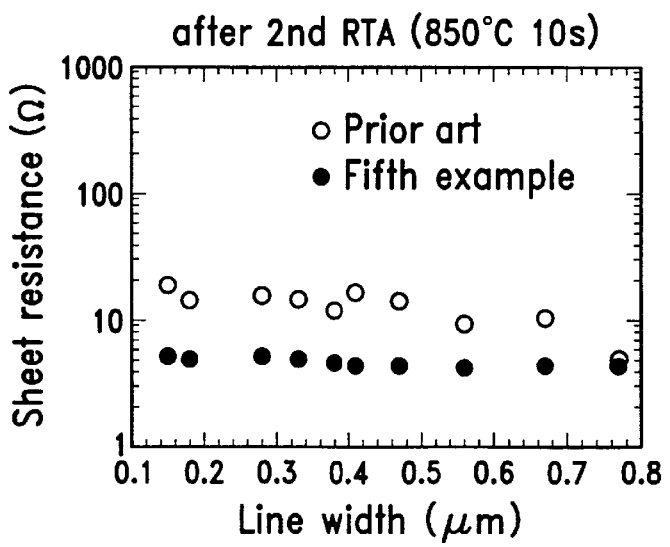
Figure 14D:
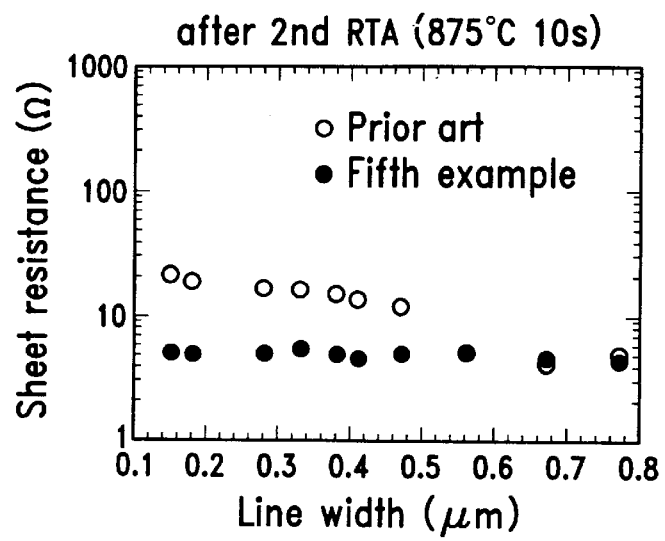
Figure 14E:
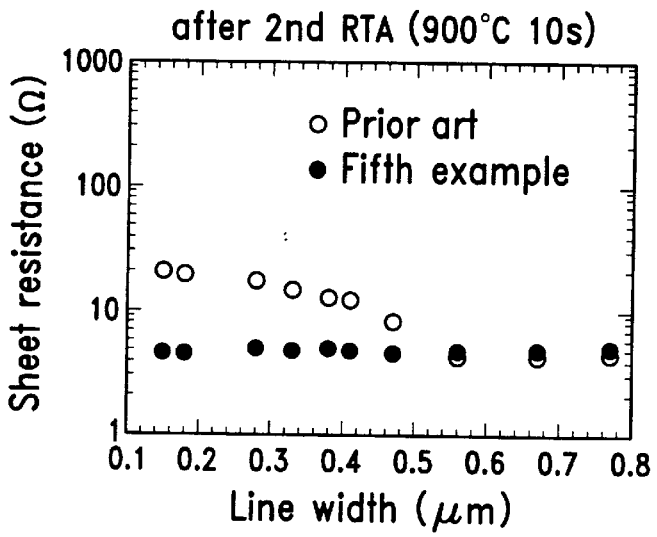
Figure 14F:
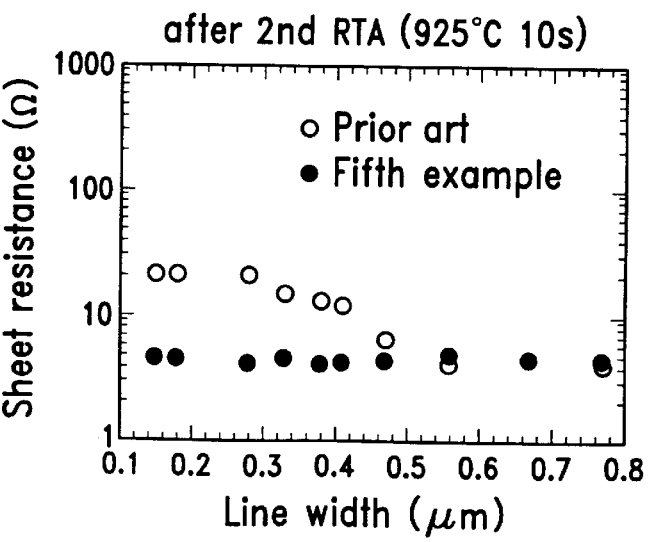
Figure 14G:
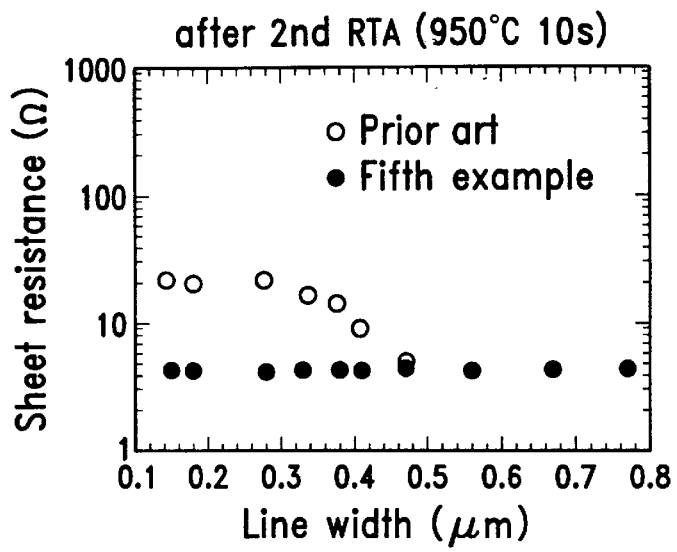
Figure 14H:
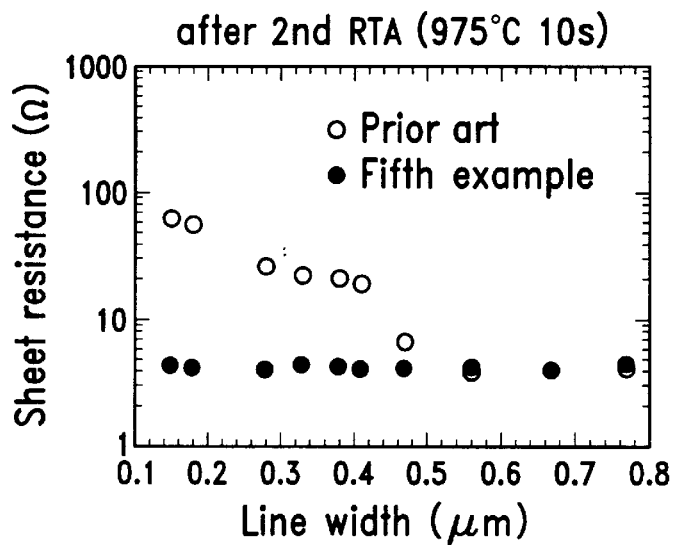
Figure 14I:
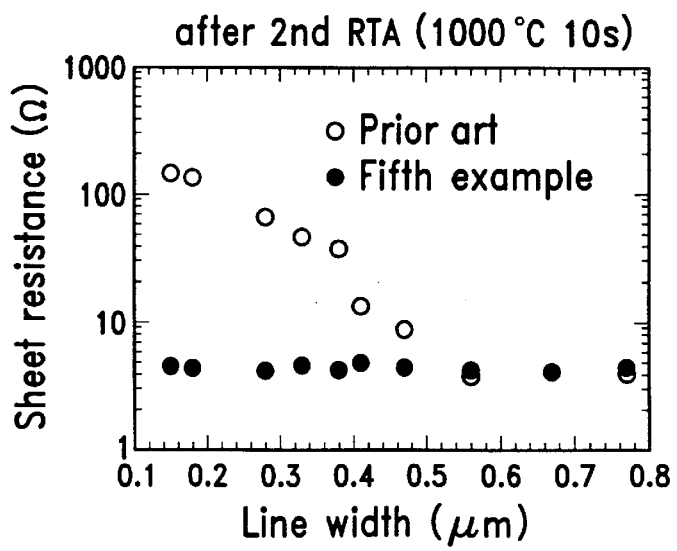

Hereinafter, the infiltration of oxygen during the silicidation reaction in the present example will be described in the order of production steps. FIG. 13A is a cross sectional view illustrating the wafer after depositing a poly-crystalline silicon film 605 (to become a gate electrode), then removing the native oxide film by treating it with hydrofluoric acid, then exposing it to and conveying it through an atmosphere, and then depositing a titanium film 511 in the titanium sputtering chamber in accordance with the conventional method. FIG. 13B is a cross sectional view of the wafer after depositing the titanium film 511 in accordance with the method of the present example.

In the conventional example, the oxygen concentration within the poly-crystalline silicon film 605 is high (at $1 \times 10^{19}$ cm$^{-3}$ or more) as illustrated in FIG. 4. Furthermore, since the wafer is carried to the sputtering chamber while being exposed to an atmosphere, the surface of the poly-crystalline silicon film is oxidized (or water molecules present in the atmosphere adhere to the surface) and a native oxide film 510 is formed at the interface between the titanium film 511 and the poly-crystalline film 605.

On the other hand, in the present example, the oxygen concentration within the poly-crystalline silicon film 505 is below the detection threshold (at $1 \times 10^{18}$ cm$^{-3}$ or less; see FIG. 4). Moreover, since the titanium film 511 is deposited after the native oxide film formed on the surface of the poly-crystalline silicon film is removed in the above-described cluster-type apparatus, it is possible to keep the oxygen concentration in the silicidation reaction system at $1 \times 10^{18}$ cm$^{-3}$ or less as a total.

Here, although the description is given of the reaction system of poly-crystalline silicon (to become a gate electrode) and titanium, the same is true for the native oxide film at the interface between the silicon substrate and the titanium film in the reaction system of the silicon semiconductor substrate (to become a source/drain region) and the titanium. Moreover, although the oxygen concentration within the silicon substrate is typically about $2 \times 10^{18}$ to $5 \times 10^{18}$ cm$^{-3}$, it is necessary to form a substantially oxygen-less and substantially defect free layer on the substrate surface by performing the IG treatment so that the oxygen concentration in the region to react with titanium is reduced.

FIGS. 13A to 13D are cross sectional views of the wafer in the conventional method and the present example, respectively, after the first step of the rapid thermal annealing (1st Step RTA) is performed.

The rapid thermal annealing in the present example is performed at 675° C. in the nitrogen environment for 10 seconds. During this time interval, in the conventional example, first the silicidation reaction proceeds while the titanium reduces the native oxide film. Moreover, since the titanium surface is exposed to a nitrogen environment, a nitridation reaction also takes place. In the end, the titanium silicide film 513 of the C49 crystal structure containing a large amount of oxygen and the titanium nitride film 512 created by nitridation reaction are formed. Moreover, in the conventional example, since the silicidation reaction proceeds while reducing the oxygen, the silicidation reaction does not uniformly proceed and the Interface between the silicon film 605 and the titanium silicide film 513 becomes uneven.

Figure 7A:
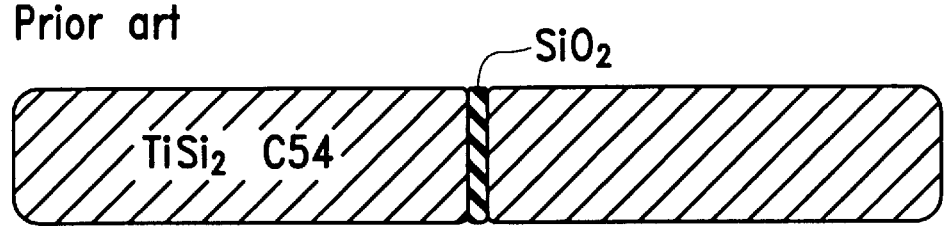
FIG. 7A is a cross sectional view schematically showing the agglomeration mechanism in the titanium silicide film formed by the conventional method.
Figure 7A:
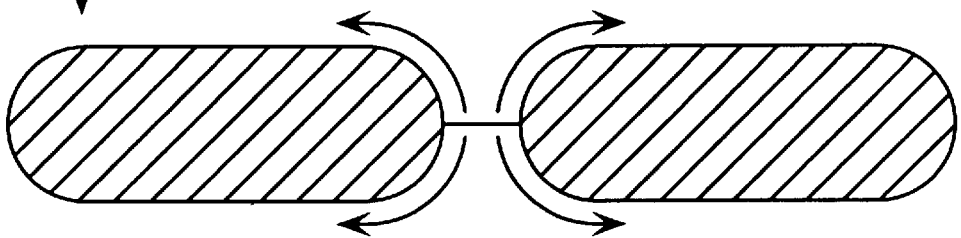

On the other hand, in the present example, since the silicidation reaction proceeds under the substantially low oxygen concentration, the titanium silicide film is uniformly formed and the interface between the silicon film 505 and the titanium silicide film 514 becomes even. Furthermore, because the silicidation reaction takes place within a nitrogen environment, the nitrogen diffuses as far as to the silicide film during the silicidation reaction, thereby creating a titanium silicide film containing the nitrogen. Of course, although the titanium silicide film in the conventional example contains nitrogen in addition to oxygen, the large amount of oxygen contained is the problem. In particular, oxygen is likely to precipitate at the grain boundary, and the situation illustrated in FIG. 7A is ultimately realized.

Figure 7B:
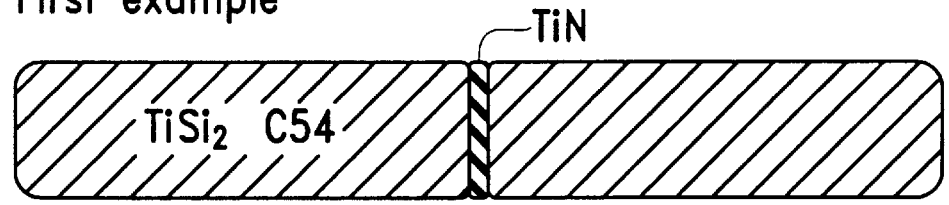
FIG. 7B is a cross sectional view schematically showing the agglomeration mechanism in the titanium silicide film formed in the first example of the present invention.
Figure 7B:
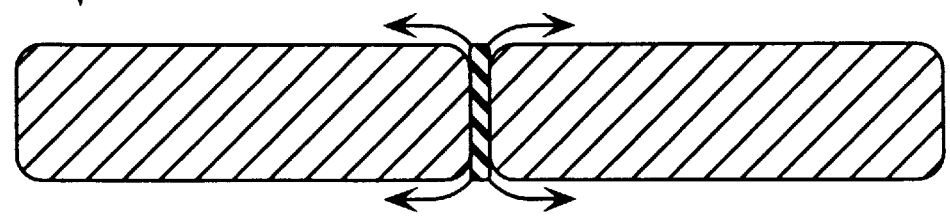

In the present example, in order to investigate the influence of the oxygen alone, titanium instead of titanium nitride was deposited and the result was compared to that of the conventional example. Because the first step of the RTA is performed in the nitrogen environment, the nitrogen precipitates at the grain boundary and a structure similar to that in the previous example illustrated in FIG. 7B is obtained. In order to actively form TiN at the grain boundary in the titanium silicide, a titanium nitride film which is rich in titanium is deposited instead of a titanium film, and then the silicidation reaction is initiated as in the previous example.

In the present example, the titanium film is formed on the silicon substrate and then annealed to form the TiSi$_2$C49 film. While this is occurring, the upper and lower portions of the Ti film becomes TiN and TiSi$_2$, respectively. Although there may be a portion of the Ti film remaining unchanged, this does not pose a problem. However, the Ti film is typically formed in accordance with the desired film thickness of the TiSi$_2$ film.

The process for removing the oxygen is not limited to those described in the present example. What is important is keeping the oxygen concentration of the system at a low level with respect to the total reaction system where silicon and titanium are reacted to form a titanium silicide film.

Illustrated in FIGS. 14A to 14I are the line width dependence of the sheet resistances of a titanium silicide film and a polyside gate electrode formed by the present example and by the conventional method. The titanium silicide films and the polyside gate electrodes according to the present example are formed by a reaction between titanium (not titanium nitride) and silicon, and between titanium and poly-crystalline silicon, respectively, within a system which substantially excludes oxygen. The titanium silicide films and the polyside gate electrodes according to the conventional method are formed by a reaction between titanium and silicon, and between titanium and poly-crystalline silicon, respectively, within a system including oxygen.

As apparent from FIGS. 14A to 14I, the titanium silicide film containing oxygen in the conventional example requires a high temperature heat treatment to make the phase transition take place from C49 (high resistance) to C54 (low resistance). In other words, the phase transition from C49 to C54 is inhibited by the exhistence of oxygen.

Moreover, as the line width becomes smaller, the resistance rises. The reason is as follows. As illustrated in FIG. 7A, due to the precipitation f oxygen at the grain boundary, a high resistance oxide film is formed. As the lines become finer, the structure becomes a bamboo structure, thereby blocking the current path with the oxide film and therefore raising the resistance. Moreover, in the conventional example, as the line width becomes small, the heat-resistance becomes degraded and the resistance rises. At the line width of 0.6 μm or less, the temperature at which the agglomeration begins is lower than the temperature at which the phase transition to the low resistance C54 crystal structure takes place. That is, even if the second RTA is performed at high temperature, the resistance does not decrease due to the phase transition but rather increases due to the agglomeration. This phenomena primarily attributable to the bamboo structure under the fine wiring. In addition, as shown in FIG. 7A, the poor heat-resistance and the agglomeration due to the migration resulting from the large surface free energy also contribute, thereby severing the silicide film.

In the conventional example, with the wiring having the line width of 0.2 μm or less, the sheet resistance after the second RTA performed at 1000° C. exceeds 100 Ω. This indicates that the silicide film has already completely been agglomerated and isolated in stripe configuration, and the sheet resistance thereof has become the sheet resistance of the poly-crystalline silicon film (the silicide film is severed and does not contribute to the gate sheet resistance). On the other hand, in the present example where oxygen is removed as much as possible, the phase transition from C49 (high resistance) to C54 (low resistance) occurs at low temperature (and therefore is likely to make the phase transition). The heat-resistance is excellent and no increase at all in sheet resistance occurs even after the second RTA performed at 1000° C. is observed. The sheet resistance does not depend on the line width and keeps the low resistance down to fine wiring.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A method for fabricating a semiconductor device, the method comprising the steps of:

providing an oxygen concentration in a region of a silicon film of $1 \times 10^{18}$ cm$^{-3}$ or less;

depositing a film including a metal on the silicon film; and reacting the silicon film with the film including a metal so as to form a metal silicide film in the region of the silicon film, wherein the region of the silicon film includes a surface of the silicon film and an interior portion of the silicon film underlying the surface.

2. A method for fabricating a semiconductor device according to claim 1, wherein the film including a metal comprises a titanium film, and the metal silicide film comprises a titanium silicide film.

3. A method for fabricating a semiconductor device according to claim 1, wherein the film including a metal comprises a titanium nitride film in which titanium atoms are more than nitride atoms, and the metal silicide film comprises a titanium silicide film.

4. A method for fabricating a semiconductor device according to claim 2, the method further comprising the step of forming the titanium silicide film including TiSi$_2$ C54 crystal grains which are in contact with each other via TiN.

5. A method for fabricating a semiconductor device according to claim 3, the method further comprising the step of forming the titanium silicide film including TiSi$_2$ C54 crystal grains which are in contact with each other via TiN.

6. A method for fabricating a semiconductor device according to claim 2, the method further comprising the step of:

implanting silicon ions in the vicinity of an interface between the titanium film and the silicon film, after depositing the titanium film and before reacting the silicon film with the titanium film.

7. A method for fabricating a semiconductor device according to claim 3, the method further comprising the step of:

implanting silicon ions in the vicinity of an interface between the titanium nitride film and the silicon film, after depositing the titanium nitride film and before reacting the silicon film with the titanium nitride film.

8. A method for fabricating a semiconductor device according to claim 4, the method further comprising the step of:

implanting silicon ions in the vicinity of an interface between the titanium film and the silicon film, after depositing the titanium film and before reacting the silicon film with the titanium film.

9. A method for fabricating a semiconductor device according to claim 5, the method further comprising the step of:

implanting silicon ions in the vicinity of an interface between the titanium nitride film and the silicon film, after depositing the titanium nitride film and before reacting the silicon film with the titanium nitride film.

10. A method for fabricating a semiconductor device according to claim 3, wherein the titanium nitride film is deposited by a reactive sputtering method using a titanium target in a mixture gas of an argon gas and a nitrogen gas, the mixing ratio of the nitrogen gas in the mixture gas being in the range of 0.1% to 10%.

11. A method for fabricating a semiconductor device according to claim 5, wherein the titanium nitride film is deposited by a reactive sputtering method using a titanium target in a mixture gas of an argon gas and a nitrogen gas, the mixing ratio of the nitrogen gas in the mixture gas being in the range of 0.1% to 10%.

12. A method for fabricating a semiconductor device according to claim 7, wherein the titanium nitride film is deposited by a reactive sputtering method using a titanium target in a mixture gas of an argon gas and a nitrogen gas, the mixing ratio of the nitrogen gas in the mixture gas being in the range of 0.1% to 10%.

13. A method for fabricating a semiconductor device according to claim 2, the method further comprising the steps of:

removing a native oxide film on the silicon film and then depositing the titanium film on the silicon film without being open to atmosphere;

performing a first rapid thermal annealing in a nitrogen gas and making the titanium film and the silicon film react with each other so as to form a titanium silicide film having a TiSi$_2$ C49 crystal structure which is stoichiometrically metastable, and form a titanium nitride film in the surface region of the titanium film above the titanium silicide film;

implanting impurities serving as donors or acceptors into the titanium silicide film and the silicon film beneath the titanium silicide file by an ion implantation method, said implanting being performed through the titanium nitride film above the titanium silicide film;

selectively removing the titanium nitride film above the titanium silicide film end the titanium nitride film located in a region where the titanium silicide film is not formed; and changing the titanium silicide film into a TiSi$_2$ C54 crystal structure which is stoichiometrically stable by a second rapid thermal annealing.

14. A method for fabricating a semiconductor device according to claim 3, the method further comprising the steps of:

removing a native oxide film on the silicon film and then depositing the titanium nitride film on the silicon film without being exposed to atmosphere;

performing a first rapid thermal annealing in a nitrogen gas thereby causing the titanium nitride film and the silicon film to react with each other so as to form a titanium silicide film having a TiSi$_2$ C49 crystal structure which is stoichiometrically metastable, and form a titanium nitride film in the surface region of the titanium nitride film above the titanium silicide film;

implanting impurities serving as donors or acceptors into the titanium silicide film and the silicon film beneath the titanium silicide film by an ion implantation method, said implanting being performed through the titanium nitride film above the titanium silicide film;

selectively removing the titanium nitride film above the titanium silicide film and the titanium nitride film located in a region where the titanium silicide film is not formed; and changing the titanium silicide film into a TiSi$_2$ C54 crystal structure which is stoichiometrically stable by a second rapid thermal annealing.

15. A method for fabricating a semiconductor device according to claim 13, the method further comprising the step of:

implanting silicon ions in the vicinity of an interface between the titanium film and the silicon film, said implanting of silicon ions being performed after depositing the titanium film and before the first rapid thermal annealing.

16. A method for fabricating a semiconductor device according to claim 14, the method further comprising the step of:

implanting silicon ions in the vicinity of an interface between the titanium nitride film and the silicon film, said implanting of silicon ions being performed after depositing the titanium nitride film and before the first rapid thermal annealing.

17. A method for fabricating a semiconductor device according to claim 1, the method further comprising the step of providing an oxygen concentration in a total region including the region of the silicon film, a region of the film including a metal corresponding to the region of the silicon film, and an interface of the silicon film and the film including a metal, in which the titanium silicide film is to be formed is $1\times10^{18}$ cm$^{-3}$ or less.

18. A method for fabricating a semiconductor device according to claim 1, wherein the metal comprises a refractory metal.

19. A method for fabricating a semiconductor device according to claim 1, wherein the step of reacting the silicon film with the film including a metal comprises a step of annealing the silicon film and the film including a metal.

20. A method for fabricating a semiconductor device according to claim 9, wherein the titanium nitride film is deposited by a reactive sputtering method using a titanium target in a mixture gas of an argon gas and a nitrogen gas, the mixing ratio of the nitrogen gas in the mixture gas being in the range of 0.1% to 10%.

* * * * *

UNITED STATES PATENT AND TRADEMARK OFFICE
CERTIFICATE OF CORRECTION

PATENT NO. : 5,849,634
DATED : December 15, 1998
INVENTOR(S) : Hiroshi, Iwata

It is certified that error appears in the above-identified patent and that said Letters Patent is hereby corrected as shown below:

On the title page, item -- [73] Assignee: Sharp Kabushiki Kaisha, Osaka, Japan--.

Signed and Sealed this

Thirteenth Day of July, 1999

Attest:

Q. TODD DICKINSON

*Attesting Officer*     *Acting Commissioner of Patents and Trademarks*